(12) United States Patent
Singh et al.

(10) Patent No.: US 7,376,307 B2
(45) Date of Patent: May 20, 2008

(54) MULTIMODE LONG PERIOD FIBER BRAGG GRATING MACHINED BY ULTRAFAST LASER DIRECT WRITING

(75) Inventors: Rajminder Singh, Shrewsbury, MA (US); Ming Li, Chelmsford, MA (US); Jimmy Yi-Jie Jia, Cambridge, MA (US); Xinbing Liu, Acton, MA (US); Tetsuo Ohara, Sutton, MA (US)

(73) Assignee: Matsushita Electric Industrial Co., Ltd, Osaka (JP)

( * ) Notice: Subject to any disclaimer, the term of this patent is extended or adjusted under 35 U.S.C. 154(b) by 352 days.

(21) Appl. No.: 10/976,524

(22) Filed: Oct. 29, 2004

(65) Prior Publication Data

US 2006/0093012 A1 May 4, 2006

(51) Int. Cl.
*G02B 6/34* (2006.01)
(52) U.S. Cl. ........................................ 385/37
(58) Field of Classification Search .............. None
See application file for complete search history.

(56) References Cited

U.S. PATENT DOCUMENTS

| | | | | |
|---|---|---|---|---|
| 4,911,516 A | * | 3/1990 | Palfrey et al. | 385/37 |
| 5,848,204 A | * | 12/1998 | Wanser | 385/12 |
| 6,195,483 B1 | * | 2/2001 | Moon et al. | 385/37 |
| 6,229,939 B1 | * | 5/2001 | Komine | 385/29 |
| 6,282,341 B1 | * | 8/2001 | Digonnet et al. | 385/37 |
| 6,347,171 B1 | | 2/2002 | Tatah et al. | |
| 7,174,077 B1 | * | 2/2007 | Howard | 385/123 |
| 2002/0003926 A1 | * | 1/2002 | Enomoto et al. | 385/37 |
| 2003/0138229 A1 | * | 7/2003 | Paek et al. | 385/123 |
| 2004/0184734 A1 | * | 9/2004 | Mihailov et al. | 385/37 |
| 2004/0252939 A1 | * | 12/2004 | Gaylord et al. | 385/28 |

OTHER PUBLICATIONS

K.O. Hill et al. Photosensitivity in optical fiber waveguides: Application to reflection filter fabrication. Applied Physics Letters, 32(10), pp. 647-649, May 1978.*

Stephen J. Mihailov et al., Fiber Bragg gratings made with a phase mask and 800-nm femtosecond radiation, Optics Letters, Jun. 15, 2003, pp. 995-997, vol. 28, No. 12.

Eric Fertein et al., Refractive-index changes of standard telecommunication fiber through exposure to femtosecond laser pulses at 810 cm, Applied Optics, Jul. 20, 2001, pp. 3506-3508, vol. 40, No. 21.

(Continued)

*Primary Examiner*—Sung Pak
*Assistant Examiner*—Mike Stahl
(74) *Attorney, Agent, or Firm*—RatnerPrestia

(57) ABSTRACT

A multimode long period fiber Bragg grating (LPFBG) for a predetermined wavelength band. The LPFBG formed of a non-photosensitive material having an initial index of refraction. The multimode optical fiber core includes a substantially cylindrical surface, a longitudinal core axis, a core radius, and a number of index-altered portions having an altered index of refraction different from the initial cladding index of refraction. Each of the index-altered multimode optical fiber core has a first transmission surface and second transmission surface that is substantially parallel to the first transmission surface. Also, these index-altered portions are arranged within the non-photosensitive material of the multimode optical fiber core such that the first transmission surface of one portion of the plurality of index-altered portions is substantially parallel to the second transmission surface of a neighboring portion to form a long period Bragg grating structure.

108 Claims, 14 Drawing Sheets

OTHER PUBLICATIONS

Yun-Jiang Rao et al., Novel Fiber-Optic Sensors Based on Long-Period Fiber Gratings Written by High-Frequency $CO_2$ Laser Pulses, Journal of Lightwave Technology, May 2003, pp. 1320-1327, vol. 21, No. 5.

P.G. Kryukov et al., Long-Period Fibre Grating Fabrication with Femtosecond Pulse Radiation At Different Wavelengths; Microelectronic Engineering, vol. 69, pp. 248-255; Publication Sep. 2003.

* cited by examiner

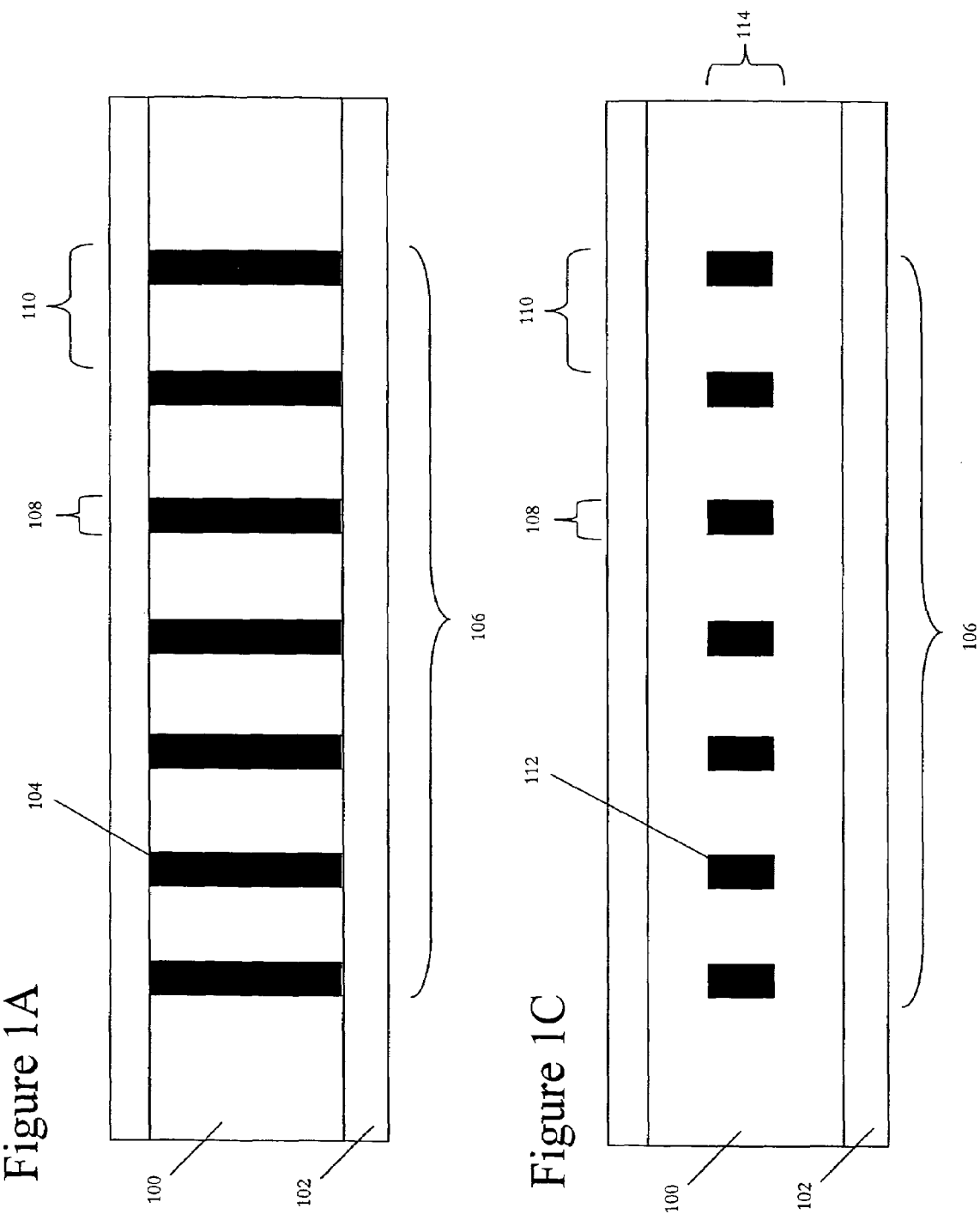

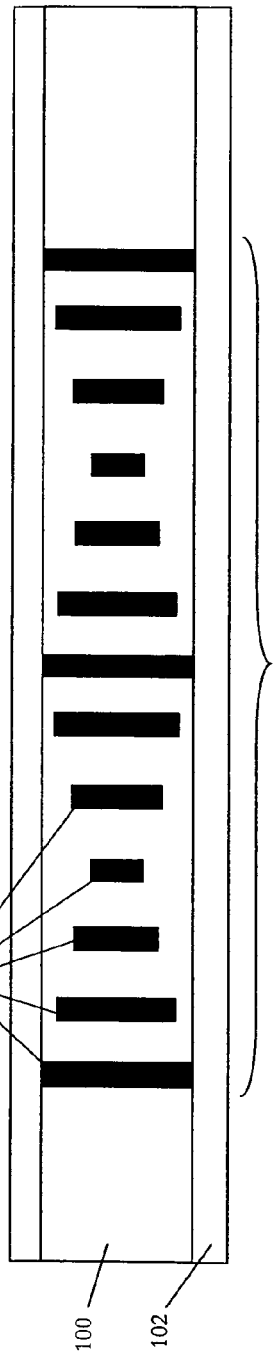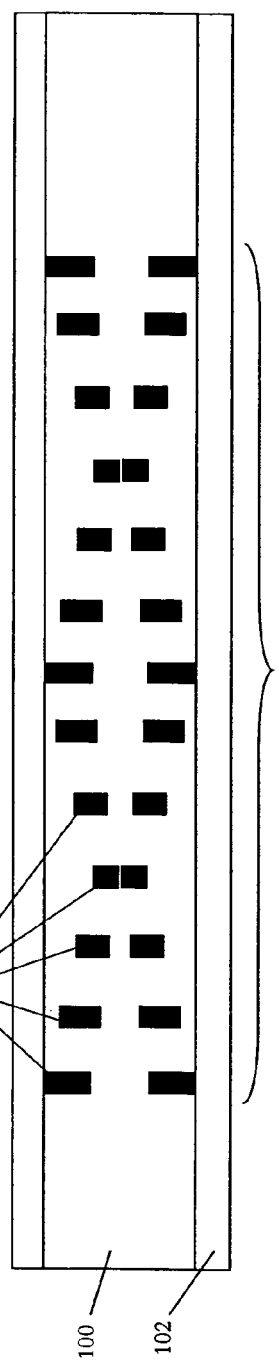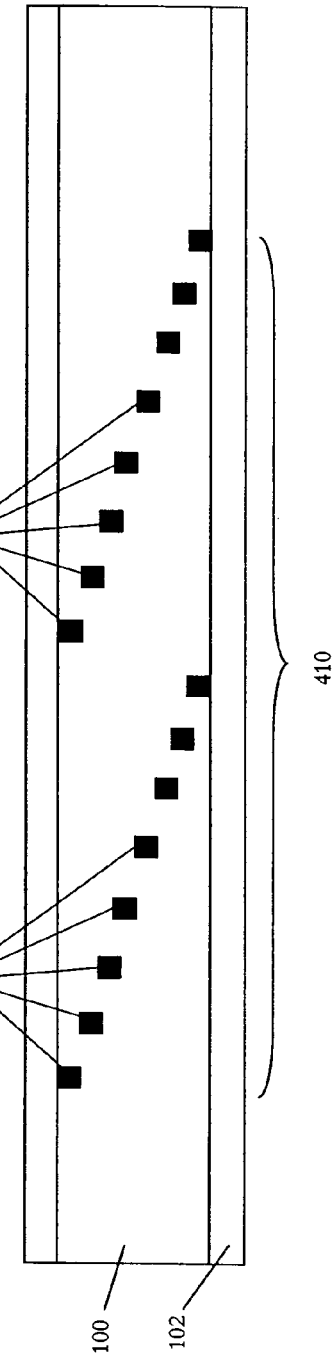

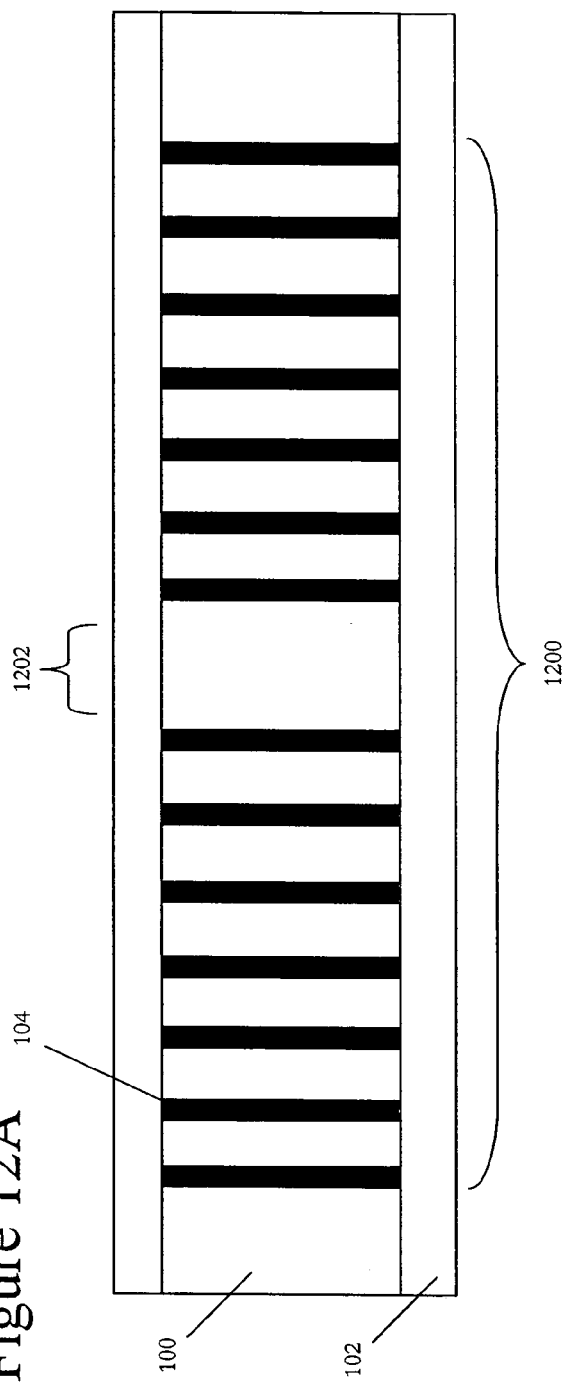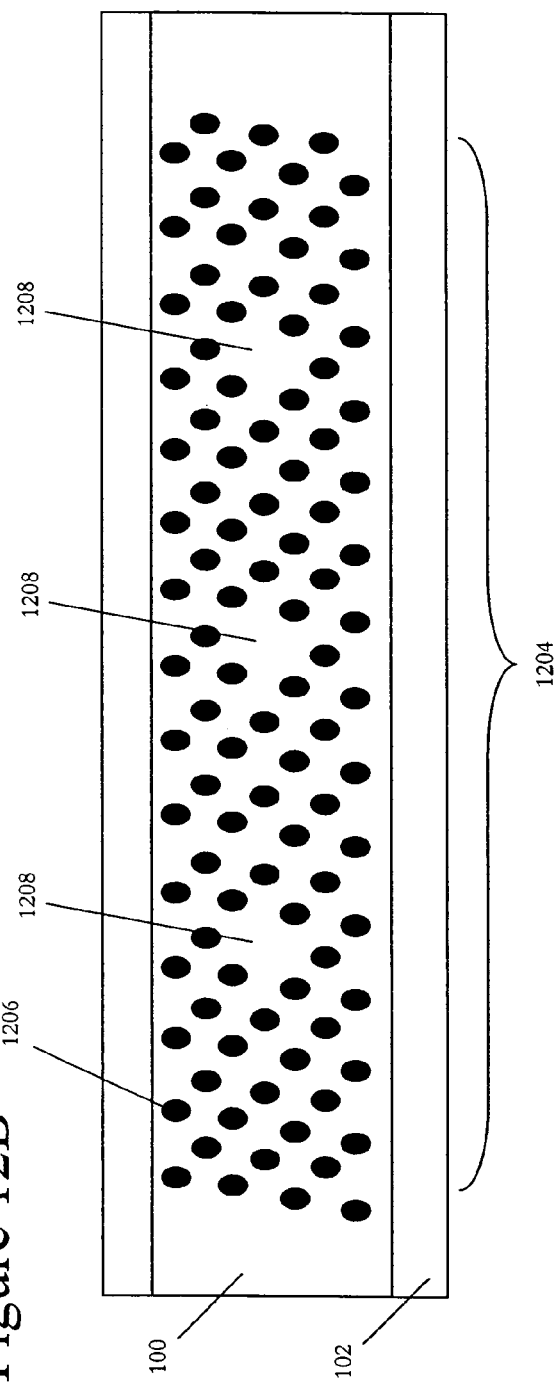

MULTIMODE LONG PERIOD FIBER BRAGG GRATING MACHINED BY ULTRAFAST LASER DIRECT WRITING

FIELD OF THE INVENTION

The present invention relates generally to structures formed in optical fibers by ultrafast laser direct writing. More particularly these structures may be long period Bragg gratings, photonic crystal structures, and/or diffractive optical elements formed within the cores of multimode optical fibers.

BACKGROUND OF THE INVENTION

A Bragg grating is a periodic or aperiodic perturbation of the effective absorption coefficient and/or the effective refractive index of an optical waveguide. More simply put, a Bragg grating can reflect a predetermined narrow or broad range of wavelengths of light incident on the grating, while passing all other wavelengths of the light. Such structures provide a desirable means to manipulate light traveling in the optical waveguide.

A fiber Bragg grating (FBG) is a Bragg grating formed in an optical fiber. FBG's may be formed from photo-imprinted gratings in optical fibers. Photo-imprinting involves the irradiation of an optical waveguide with a laser beam of ultraviolet light to change the refractive index of the core of the waveguide. By irradiating the fiber with an intensive pattern that has a periodic (or aperiodic) distribution, a corresponding index perturbation is permanently induced in the core of the waveguide. The result is an index grating that is photo-imprinted in the optical waveguide. This method requires that the glass be photosensitive, an effect discovered in 1978 by Dr. Kenneth Hill of the Communications Research Centre Canada.

The FBG may become a very selective spatial reflector in the core of the fiber. Any change to the spatial period of the grating, or index of refraction, causes a proportional shift in the reflected and transmitted spectrum. FBG's have proven attractive in a wide variety of optical fiber applications, such as: narrowband and broadband tunable filters; optical fiber mode converters; wavelength selective filters, multiplexers, and add/drop Mach-Zehnder interferometers; dispersion compensation in long-distance telecommunication networks; gain equalization and improved pump efficiency in erbium-doped fiber amplifiers; spectrum analyzers; specialized narrowband lasers; and optical strain gauges in bridges, building structures, elevators, reactors, composites, mines and smart structures.

Since their market introduction in 1995, the use of optical FBG's in commercial products has grown exponentially, largely in the fields of telecommunications and stress sensors. The demand for more bandwidth in telecommunication networks has rapidly expanded the development of new optical components and devices (especially Wavelength Division Multiplexers). FBG's have contributed to the phenomenal growth of some of these products, and are recognized as a significant enabling technology for improving fiber optic communications.

Photo-imprinted FBG's may have low insertion losses and are compatible with existing optical fibers used in telecommunication networks, but as the optical power being transmitted in a photo-imprinted FBG increases, some undesirable effects may arise. One drawback of photo-imprinted FBG's is the requirement that the optical fiber have a photosensitive core. Photosensitive materials typically have absorption coefficients higher than are desirable for high power applications, as well as potentially undesirable non-linearities that may become large at high optical powers. Photo-imprinted FBG's are also susceptible to degradation over time, particularly is the photosensitive material of the fiber core is heated or exposed to UV radiation.

In their article, FIBER BRAGG GRATINGS MADE WITH A PHASE MASK AND 800-NM FEMTOSECOND RADIATION (Optics Letters, Vol. 28, No. 12, pgs. 995-97 (2003)), Stephen J. Mihailov, et al. disclose a first order FBG formed in a single mode fiber using a femtosecond laser. The single mode fiber used was a standard SMG-28 telecommunications fiber with a non-photosensitive Ge doped core. The authors were able to form a first order Bragg grating structure in this core. This direct laser written single mode FBG was found to have superior thermal stability as compared to a photo-imprinted FBG.

Although the direct laser written single mode FBG of Stephen J. Mihailov, et al. may overcome many of the disadvantages of the photo-imprinted FBG's, the present invention includes a number of additional improvements that may provide superior performance, particularly at higher power levels, and increased versatility of the Bragg grating structures that may be formed. Additionally, the present invention includes additional diffractive structures that may be formed in optical fibers to control and monitor light propagating in the fiber.

SUMMARY OF THE INVENTION

An exemplary embodiment of the present invention is a multimode long period fiber Bragg grating (LPFBG) for a predetermined wavelength band. The LPFBG formed of a non-photosensitive material having an initial index of refraction. The multimode optical fiber core includes a substantially cylindrical surface, a longitudinal core axis, a core radius, and a number of index-altered portions having an altered index of refraction different from the initial cladding index of refraction. Each of the index-altered multimode optical fiber core has a first transmission surface and second transmission surface that is substantially parallel to the first transmission surface. Also, these index-altered portions are arranged within the non-photosensitive material of the multimode optical fiber core such that the first transmission surface of one portion of the plurality of index-altered portions is substantially parallel to the second transmission surface of a neighboring portion to form a long period Bragg grating structure.

Another exemplary embodiment of the present invention is a fiber Bragg grating (FBG) for a predetermined wavelength band. The FBG includes: an optical fiber core having a substantially cylindrical surface, a longitudinal core axis, and a core radius; and a cladding layer formed of a non-photosensitive material on the substantially cylindrical surface of the optical fiber core. The optical fiber core has a core index of refraction and the non-photosensitive material of the cladding layer has an initial cladding index of refraction that is lower than the core index of refraction. The cladding layer includes an outer cladding radius and a number of index-altered portions having an altered index of refraction different from the initial cladding index of refraction. Each of the index-altered portions of the cladding layer extends into the cladding layer from the substantially cylindrical surface of the optical fiber core. Also, these index-altered portions are arranged within the non-photosensitive material of the cladding layer to form a Bragg grating structure.

A further exemplary embodiment of the present invention is an optical fiber with integral photonic crystal section. The optical fiber includes an optical fiber core formed of a non-photosensitive material having an initial index of refraction. The optical fiber core includes a substantially planar end surface, a substantially cylindrical surface, a longitudinal core axis, a core radius, and a coupling section adjacent to the substantially planar end surface with a number of index-altered portions. The index-altered portions have an altered index of refraction that is different from the initial index of refraction and are arranged within the coupling section of the optical fiber core to form a photonic crystal structure.

An additional exemplary embodiment of the present invention is an optical fiber with integral diffractive coupling optics. The optical fiber includes an optical fiber core formed of a non-photosensitive material having an initial index of refraction. The optical fiber core includes a substantially planar end surface, a substantially cylindrical surface, a longitudinal core axis, a core radius, and a coupling section adjacent to the substantially planar end surface with a number of index-altered portions. The index-altered portions have an altered index of refraction that is different from the initial index of refraction and are arranged within the coupling section of the optical fiber core to form the integral diffractive coupling optics.

Yet another exemplary embodiment of the present invention is a wavelength stabilized, high power, uncooled laser source. The wavelength stabilized, high power, uncooled laser source includes one or more high power laser(s) and a multimode optical fiber with a LPFBG that is optically coupled to the high power laser(s). The multimode optical fiber includes a multimode core formed of a non-photosensitive material having an initial index of refraction. This multimode core includes a substantially cylindrical surface, a longitudinal core axis, a core radius, and a number of index-altered portions. The index-altered portions have an altered index of refraction that is different from the initial index of refraction and are arranged within the non-photosensitive material of the multimode core to form a long period Bragg grating structure. This long period Bragg grating structure reflects a predetermined fraction of light in a predetermined wavelength band that is propagating in the multimode core back into the high power laser(s). This desirably locks the output wavelength band of the wavelength stabilized, high power, uncooled laser source to the predetermined wavelength band.

Yet a further exemplary embodiment of the present invention is a multimode optical fiber with a helical fiber Bragg grating. The optical fiber includes a multimode optical fiber core formed of a non-photosensitive material having an initial index of refraction. The optical fiber core has a substantially cylindrical surface, a longitudinal core axis, a core radius, and a helical index-altered portion having an altered index of refraction different from the initial index of refraction. This helical index-altered portion includes a longitudinal index-altered portion axis that is coaxial to the core axis of the core, an index-altered portion outer radius, an index-altered portion inner radius which is less than the index-altered portion outer radius, and a longitudinal pitch. Also, the helical index-altered portion is arranged within the non-photosensitive material of the multimode optical fiber core to form a long period Bragg grating structure.

Yet an additional exemplary embodiment of the present invention is an optical fiber with an alternative helical fiber Bragg grating. The optical fiber includes: an optical fiber core having a substantially cylindrical surface, a longitudinal core axis, and a core radius; and a cladding layer formed of a non-photosensitive material on the substantially cylindrical surface of the optical fiber core. The optical fiber core has a core index of refraction and the non-photosensitive material of the cladding layer has an initial cladding index of refraction that is lower than the core index of refraction. The cladding layer includes an outer cladding radius and a helical index-altered portion having an altered index of refraction different from the initial cladding index of refraction. This helical index-altered portion includes a longitudinal index-altered portion axis that is coaxial to the core axis of the core, an index-altered portion outer radius, an index-altered portion inner radius which equal to the core radius of the optical fiber core, and a longitudinal pitch. Also, the helical index-altered portion is arranged within the non-photosensitive material of the cladding layer to form a Bragg grating structure.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

FIG. 1A is a cut-away side plan drawing illustrating an exemplary multimode long period fiber Bragg grating (LPFBG) according to the present invention cut along line 1A of FIG. 1B.

FIG. 1C is a cut-away side plan drawing illustrating an alternative exemplary multimode LPFBG according to the present invention cut along line 1C of FIG. 1D.

FIGS. 4A, 4B, and 4C are cut-away side plan drawings illustrating yet further exemplary multimode LPFBG's according to the present invention.

FIG. 12A is a cut-away side plan drawing illustrating an exemplary multimode fiber with an integral one-dimensional photonic crystal according to the present invention.

FIG. 12B is a cut-away side plan drawing illustrating an exemplary multimode fiber with an integral three-dimensional photonic crystal according to the present invention.

DETAILED DESCRIPTION OF THE INVENTION

Figure 1B:
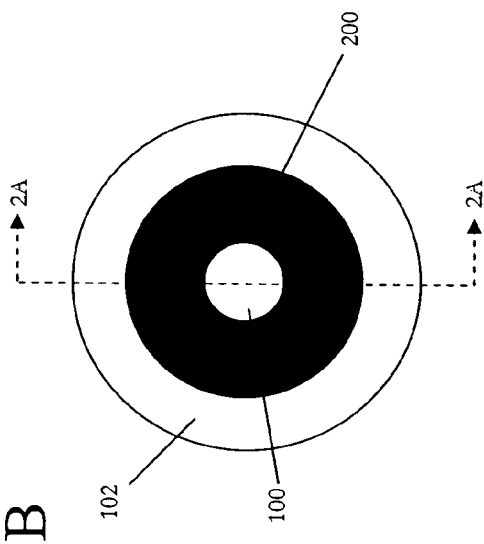
FIG. 1B is an end plan drawing illustrating the exemplary multimode LPFBG of FIG. 1A.

The extremely high intensities achievable in ultrafast laser machining of materials allow the material to be changed in a number of ways. The most common way that a material may be changed during ultrafast laser machining is for the material to be removed from the surface via ablation. Alternatively, various properties of the material may be changed such as the crystallinity and/or the refractive index. These material changes may occur on the surface of the material or, for substantially transparent materials, the ultrafast pulses may be focused within the material to cause these changes to take place inside of the bulk of the material. These internal changes may occur only above a specific fluence, so that the intervening material may be unaffected by the ultrafast laser pulses. Careful control of the pulse energy, pulse duration, and focus of the pulses may allow for the creation of precise regions with changed properties that have sharp boundaries.

Thus, the use of ultrafast lasers for direct writing of Bragg grating structures in optical fibers may have the advantage of providing sharp contrasts between index-altered portions of the fiber and surrounding unaltered portions of the fiber. Additionally, the use of an ultrafast laser machining system designed for direct writing of structures in optical fibers, such as the exemplary systems disclosed in U.S. provisional patent application ULTRAFAST LASER MACHINING SYSTEM FOR FORMING MULTIMODE LONG PERIOD FIBER BRAGG GRATING, filed concurrently with the present application, allows for the creation complex structures within optical fibers, particularly in multimode optical fibers.

Such an ultrafast laser machining system may be focused to a small region within an optical fiber. The fluence of each pulse of laser light of this exemplary ultrafast laser machining system may be controlled such that only this small region near the beam spot is machined by the pulse. The optical fiber may be moved in three dimensions so that the beam spot of the laser pulses is scanned within in the optical fiber, tracking through the portions of the non-photosensitive material of the optical fiber to be machined. The location of the machined region may be viewed through a stereo imaging system throughout the machining process to allow for more accurate machining of the diffractive structure. In this manner, a complex diffractive structure may be written three dimensionally within an optical fiber with a high level of precision.

Single mode optical fibers have relatively small fiber cores, typically less that 9 μm for telecommunication wavelengths. The creation of diffractive structures within the cores of single mode fiber may require highly accurate and precise control of the beam spot of an exemplary ultrafast laser machining system. Multimode fibers, however, may have significantly more space for forming structures within the core. This additional space may be desirable to lower the machining accuracy requirements of the laser machining system used to form these exemplary structures. Typical multimode fiber core radii range from about 10 μm to about 200 μm, with 25 μm and 31.25 μm being the most common multimode fiber core radii for telecommunication wavelengths. Also, the multiple transverse modes utilized by light propagating in multimode fibers may lead to a large number of potential structural forms for controlling and monitoring light in these fibers.

Thus, applying ultrafast laser machining techniques to multimode optical fibers may create a significant expansion of the potential uses of direct laser written structures in optical fibers over the first order, single mode FBG's disclosed in Stephen J. Mihailov, et al.'s article. Also, the use of highly accurate and precise ultrafast laser machining systems may allow for addition diffractive structures to be formed within single mode fibers.

Exemplary embodiments of the present invention include a number of diffractive structures formed within optical fibers such as: multimode long period FBG's (LPFBG's); multimode optical fibers with helical FBG structures; optical fibers with integral photonic crystal sections and/or diffractive coupling optics; and optical fibers with FBG's formed in the cladding layer. These modified optical fibers may be useful in a variety of situations, including: wavelength stabilized, high power, uncooled laser sources; dispersion compensation applications; optical filters; and in many optical telecommunications applications to name a few.

FIGS. 1A and 1B illustrate exemplary multimode LPFBG 106 designed for a predetermined wavelength band. This exemplary multimode LPFBG is formed by a number of cylindrical index-altered portions 104 with substantially planar transmission surfaces located in multimode optical fiber core 100. The transmission surfaces of each index-altered portion are substantially parallel, as are the facing transmission surfaces of neighboring index-altered portions. These index-altered portions have an index of refraction which has been altered, from the initial index of refraction of the non-photosensitive material of multimode optical fiber core 100, desirably by selective irradiation of portions of the non-photosensitive material by pulses of ultrafast laser light.

Multimode optical fiber core 100 includes a substantially cylindrical surface, a longitudinal core axis, and a core radius. Cladding layer 102 may be desirably formed on the substantially cylindrical surface of multimode optical fiber core 100. Multimode optical fiber core 100 is desirably formed of a non-photosensitive material that has an index of refraction, which may be altered by high intensity, ultrafast laser irradiation. The fractional index change between multimode optical fiber core 100 and index-altered portions 104 is dependent on the selection of the non-photosensitive material. Many materials exhibit a fractional index change between $10^{-5}$ and $10^{-3}$, with approximately $10^{-4}$ being typical, although it is noted that arsenic trioxide may exhibit a fractional index change as high as $10^{-2}$. Crystalline or semi-crystalline materials may also exhibit higher fractional index changes. In these materials the crystallinity of the index-altered portions 104 may be altered by the ultrafast laser machining, leading to a relatively higher fractional index change compared to non-crystalline materials. The non-photosensitive material of multimode optical fiber core 100 may desirably include one or more of: fused silica; borosilicate; quartz; zirconium fluoride; silver halide; chalcogenide glass; optical plastic; clear fused quartz; aluminosilicate; polymethylmeth-acrylate; polystyrene; acrylic; and/ or arsenic trioxide.

Figure 9:
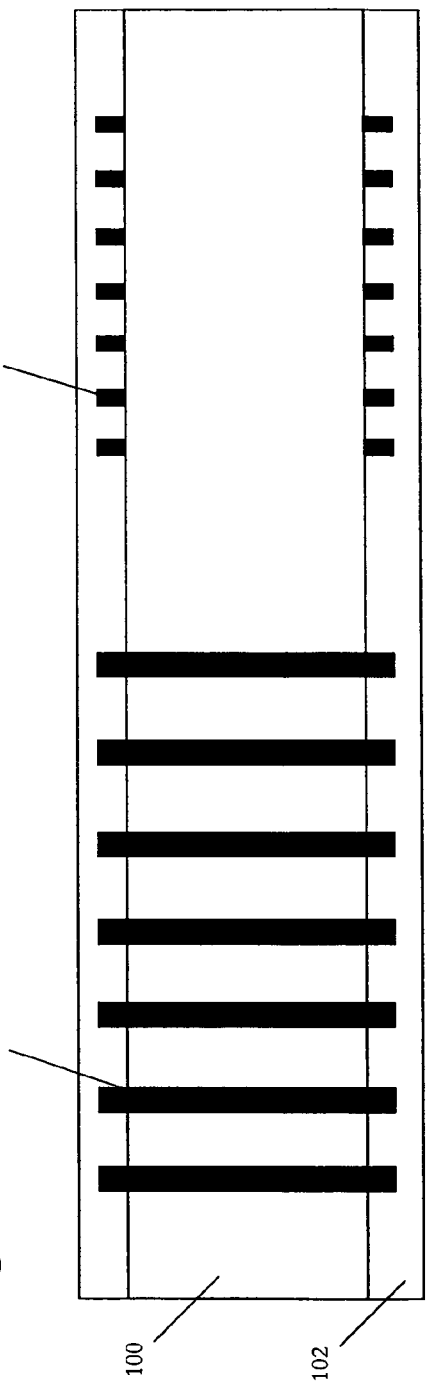
FIG. 9 is a cut-away side plan drawing of an exemplary multi-wavelength multimode fiber Bragg grating (FBG) according to the present invention illustrating two alternative Bragg grating structures.

Cladding layer 102 has a cladding index of refraction that is desirably lower than the initial index of refraction of the non-photosensitive material of the multimode optical fiber core. The cladding layer may be formed of any material typically used for optical fiber cladding, although it may be desirable to use a non-photosensitive material similar to the non-photosensitive material of multimode optical fiber core 100, particularly if it is desired to form diffractive structures in cladding layer 102, as shown in FIG. 9.

Index-altered portions 104 of the exemplary long period Bragg grating structure shown in FIGS. 1A and 1B have constant longitudinal thickness 108 and constant longitudinal pitch 110. Longitudinal thickness 108 and longitudinal pitch 110 are selected such that the resulting long period Bragg grating structure is preferentially coupled to the predetermined wavelength band. The longitudinal pitch of a long period Bragg grating structure determines the peak wavelength reflected by the structure, and the longitudinal pitch of the index-altered portions affects the Q of the grating structure and, thus, the full width half maximum of the reflected wavelength band. Desirably, longitudinal pitch 110 is greater than the longest wavelength of the predetermined wavelength band in the material. Longitudinal thickness 108 is desirably less than half of longitudinal pitch 110. The minimum longitudinal thickness is determined by the minimum feature size that may be formed by the ultrafast laser machining system used to form the LPFBG, typically greater than 10 nm.

In telecommunication wavelength bands, the index-altered portions 104 of an exemplary long period Bragg grating structure may desirably have a longitudinal thickness in the range of 1 µm to 20 µm, preferably in the range of 5 µm to 10 µm. Their longitudinal pitch may desirably be in the range of 1 µm to 500 µm, preferably in the range of 15 µm to 20 µm.

It is noted that the number of periods of the long period Bragg grating structure, the filling factor, and the fractional index change between multimode optical fiber core 100 and index-altered portions 104 determine the fraction of light reflected (or transmitted) in the predetermined wavelength band. The filling factor is a measure of the cross-sectional area of multimode fiber core 100 filled by index-altered portions 104. For example, the exemplary LPFBG of FIGS. 1A and 1B has a higher filling factor than the exemplary LPFBG of FIGS. 1C and 1D. Therefore, if the number of periods and the fractional index change of these two exemplary LPFBG's are the same, the fraction of light reflected (or transmitted) in the predetermined wavelength band by the exemplary LPFBG of FIGS. 1A and 1B is greater (less) than that of the exemplary LPFBG of FIGS. 1C and 1D.

The desired fraction of light reflected back along multimode optical fiber core 100 by long period Bragg grating structure 106 may be up to 99.9%, though for a number of applications, such as laser wavelength locking, the reflected light fraction may be preferably in the range of 3% to 20%. Although the exemplary multimode LPFBG of FIG. 1A has only seven index-altered portions 104, forming six periods of the long period Bragg grating structure, it is noted that long period Bragg grating structures of 100 or more periods may be more typical. The number of periods in an LPFBG is only limited by the length of the optical fiber. For some applications, long period Bragg grating structures with thousands, or even tens of thousands, of periods may be desirable.

Figure 1D:
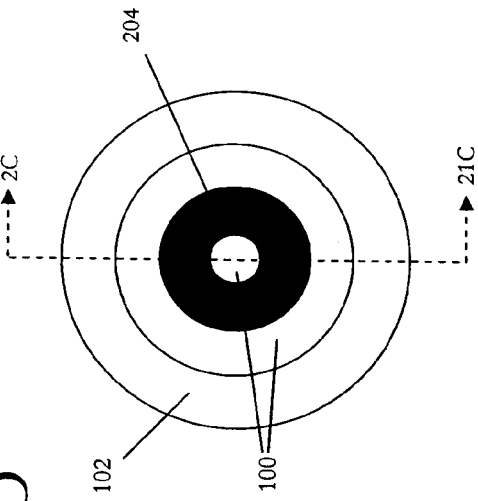
FIG. 1D is an end plan drawing illustrating the alternative exemplary multimode LPFBG of FIG. 1C.

FIGS. 1C and 1D illustrate another exemplary multimode LPFBG 106 formed by a number of cylindrical index-altered portions 112 with substantially planar transmission surfaces located in multimode optical fiber core 100. The difference between the exemplary multimode LPFBG of FIGS. 1C and 1D and that of FIGS. 1A and 1B is index-altered portion radius 114 of cylindrical index-altered portions 112 which is less than core radius of multimode optical fiber core 100. In the exemplary embodiment of FIGS. 1C and 1D, index-altered portion radius 114 provides a parameter that may selected to preferentially couple the exemplary long period Bragg grating structure to a desired subset of transverse modes of multimode optical fiber core 100.

As shown in FIG. 4A, the index-altered portion radius of cylindrical index-altered portions 400 may be varied between different index-altered portions in the longitudinal direction of multimode optical fiber core 100 to preferentially couple exemplary long period Bragg grating structure 402 to a more specific subset of transverse modes of multimode optical fiber core 100.

Figure 2B:
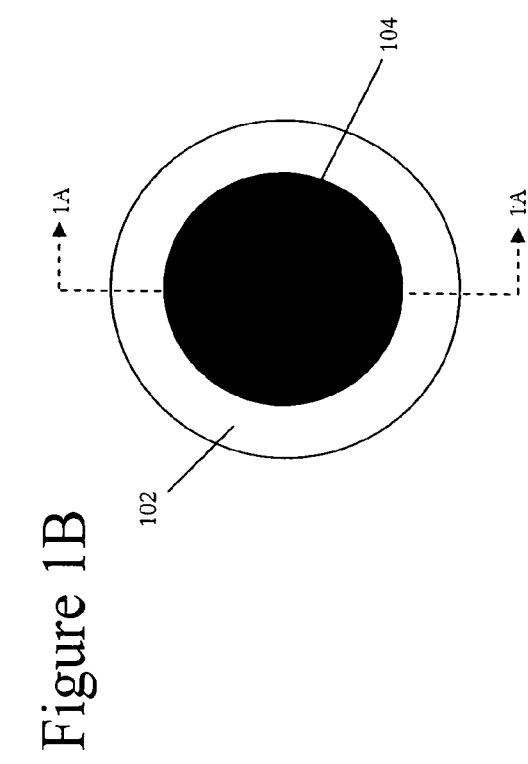
FIG. 2B is an end plan drawing illustrating the exemplary multimode LPFBG of FIG. 2A.
Figure 2D:
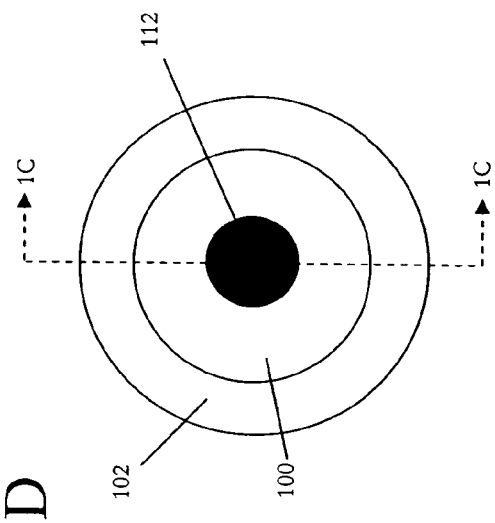
FIG. 2D is an end plan drawing illustrating the exemplary multimode LPFBG of FIG. 2C.
Figure 2A:
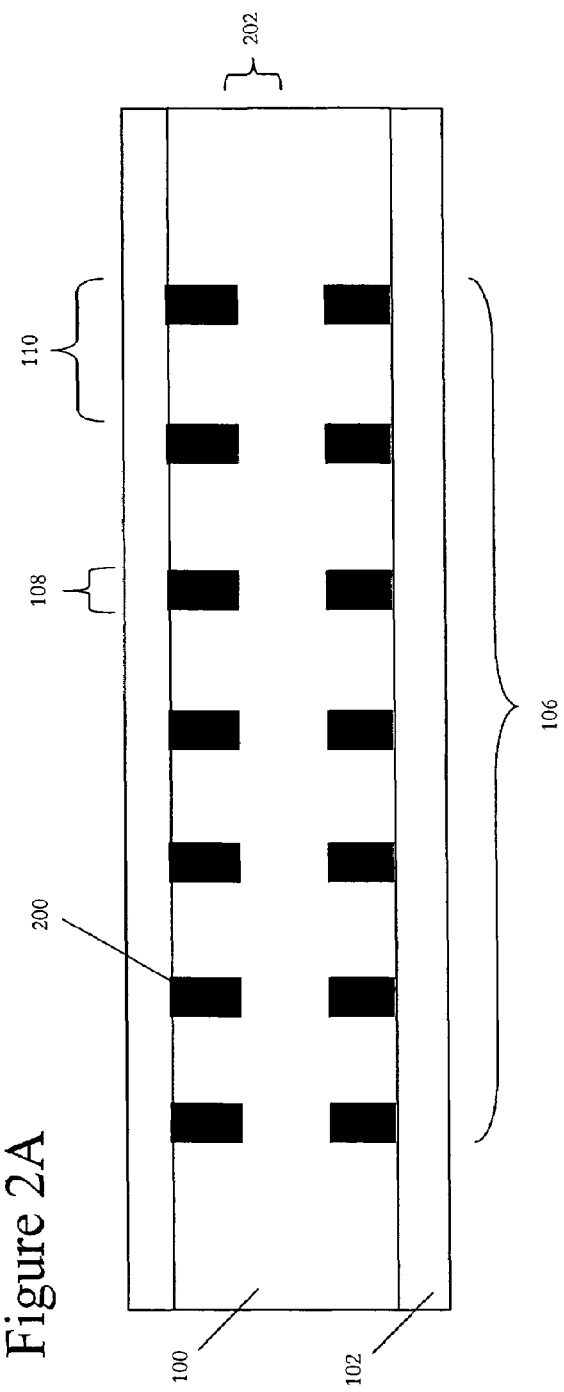
FIG. 2A is a cut-away side plan drawing illustrating another exemplary multimode LPFBG according to the present invention cut along line 2A of FIG. 2B.

FIGS. 2A and 2B illustrate alternative exemplary multimode LPFBG 106 designed for a predetermined wavelength band. This exemplary multimode LPFBG is formed by a number of annular index-altered portions 200 with substantially planar transmission surfaces located in multimode optical fiber core 100. Each of these annular index-altered portions includes: a longitudinal index-altered portion axis coaxial to the longitudinal core axis of multimode optical fiber core 100; an index-altered portion outer radius, which, in the exemplary embodiment of FIGS. 2A and 2B, is equal to the core radius; and index-altered portion inner radius 202. Index-altered portion inner radius 202 may be selected to preferentially couple long period Bragg grating structure 106 to a desired subset of transverse modes of multimode optical fiber core 100.

Figure 2C:
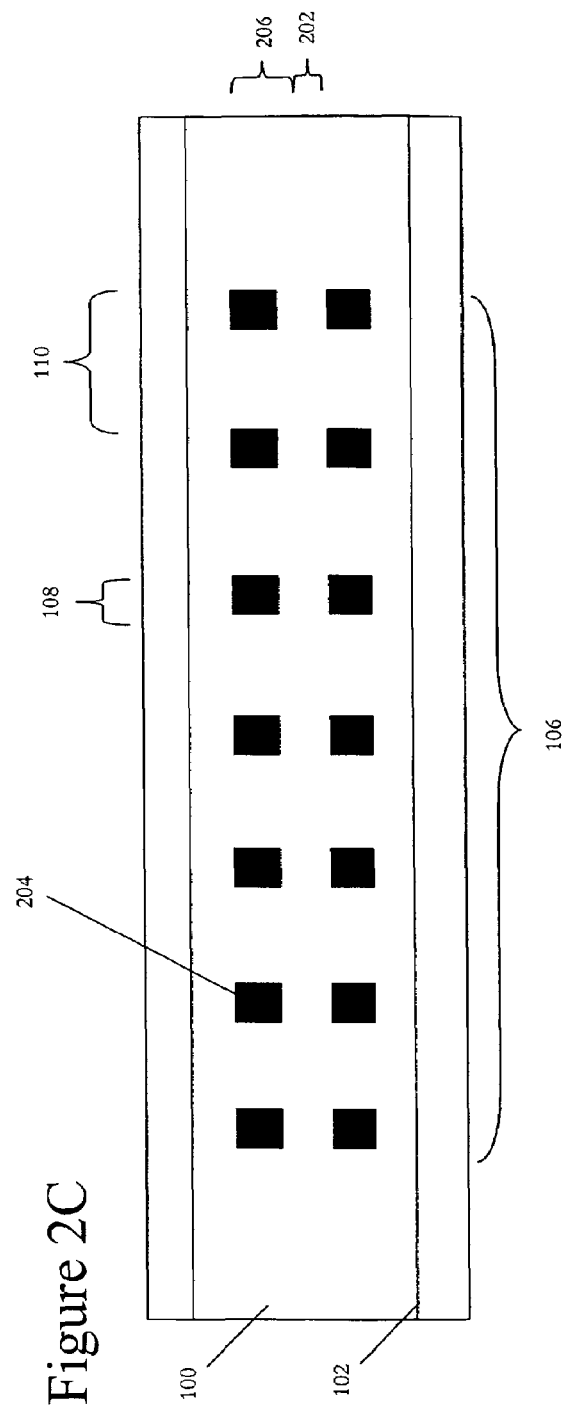
FIG. 2C is a cut-away side plan drawing illustrating a further exemplary multimode LPFBG according to the present invention cut along line 2C of FIG. 2D.

FIGS. 2C and 2D illustrate another exemplary multimode LPFBG 106 formed by a number of annular index-altered portions 204 located in multimode optical fiber core 100. The exemplary multimode LPFBG of FIGS. 2C and 2D differs from the exemplary multimode LPFBG of FIGS. 2A and 2B in that index-altered portion outer radius 206 of annular index-altered portions 204, as well as index-altered portion inner radius 202, may be varied to preferentially couple long period Bragg grating structure 106 to a desired subset of transverse modes of multimode optical fiber core 100. Also, as shown in FIG. 4B, one or both of the index-altered portion outer radius and the index-altered portion inner radius 202 of annular index-altered portions 404 may be varied between different index-altered portions in the longitudinal direction of multimode optical fiber core 100 to preferentially couple exemplary long period Bragg grating structure 406 to a more specific subset of transverse modes of multimode optical fiber core 100.

Figure 3A:
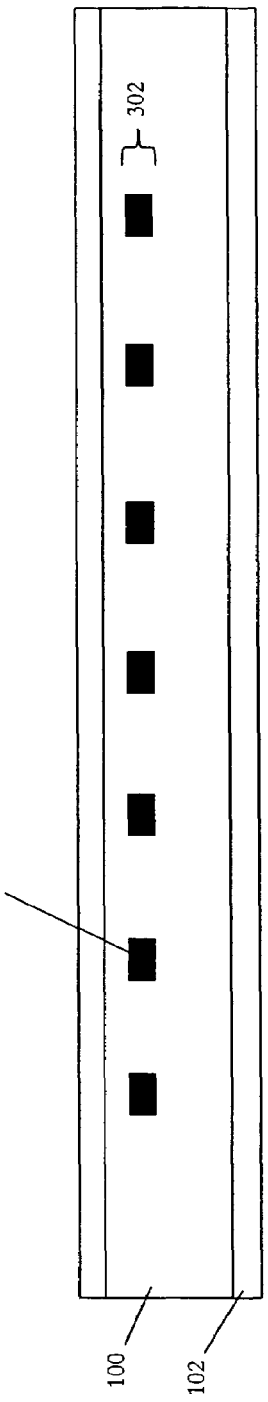
FIG. 3A is a cut-away side plan drawing illustrating an additional exemplary multimode LPFBG according to the present invention cut along line 3A of FIG. 3B.
Figure 3C:
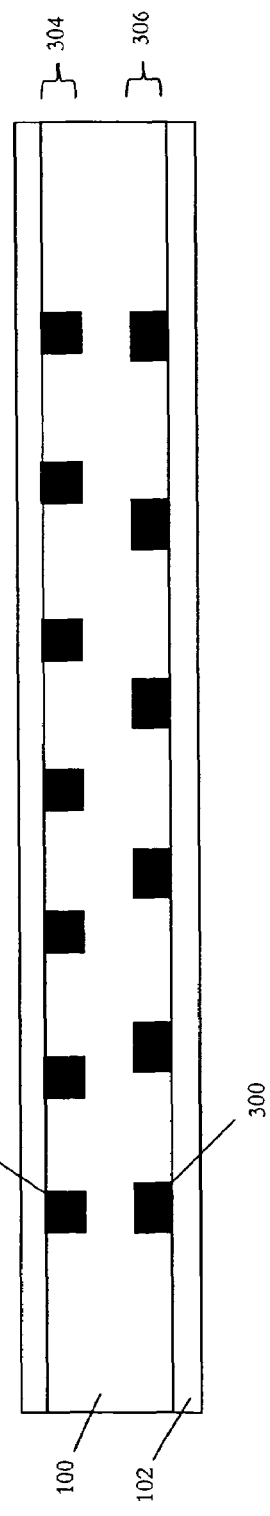
FIG. 3C is a cut-away side plan drawing illustrating an exemplary multi-wavelength multimode LPFBG according to the present invention cut along line 3C of FIG. 3D.
Figure 3E:
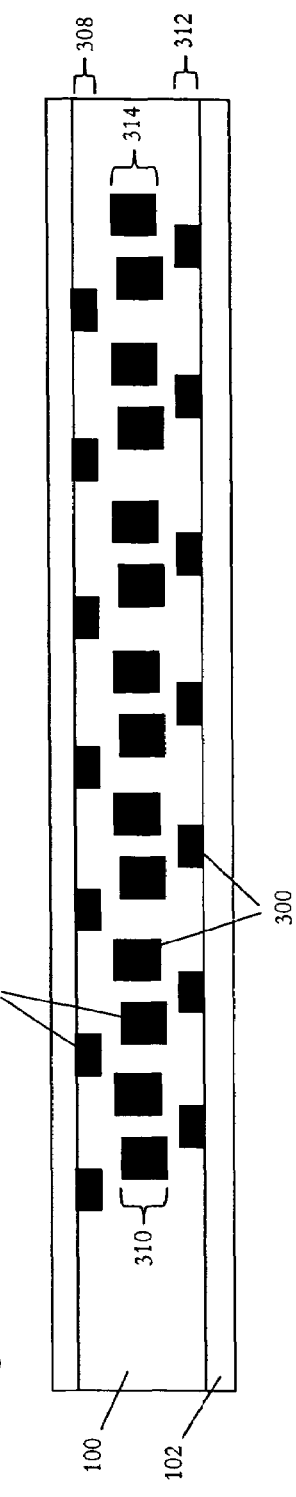
FIG. 3E is a side plan drawing illustrating yet another exemplary multimode LPFBG according to the present invention.
Figure 3F:
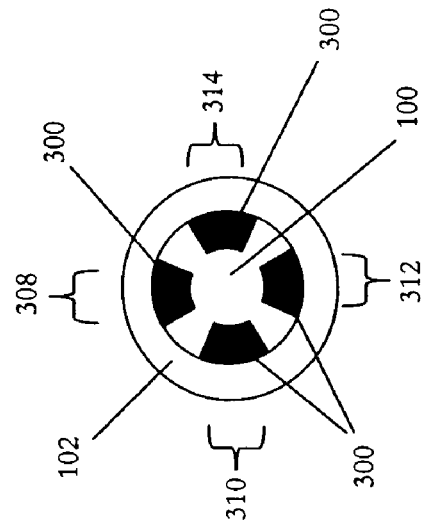
FIG. 3F is an end plan drawing illustrating the exemplary multimode LPFBG of FIG. 3E.
Figure 3B:
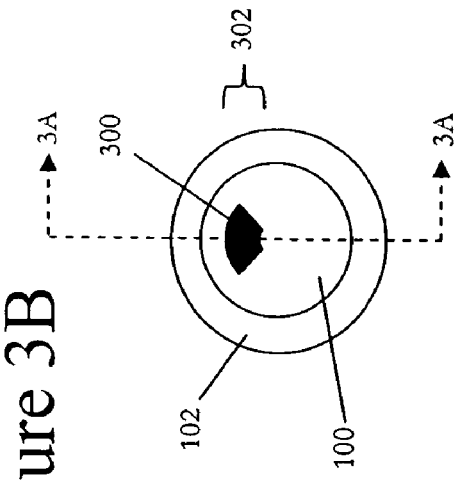
FIG. 3B is an end plan drawing illustrating the exemplary multimode LPFBG of FIG. 3A.

FIGS. 3A and 3B illustrate further exemplary multimode LPFBG 302 designed for a predetermined wavelength band. This exemplary multimode LPFBG is formed by a number of index-altered portions 300 located in multimode optical fiber core 100. Each of these index-altered portions is in the shape of an annular arcuate segment that includes: an index-altered portion outer radius, which is less than the core radius of multimode optical fiber core 100 in the exemplary embodiment of FIGS. 3A and 3B; an index-altered portion inner radius; and an angular extent around the longitudinal core axis of multimode optical fiber core 100.

Although not necessary, it may be desirable for the angular extent of annular arcuate segments to be equal to approximately 360°/n, where n is an integer greater than 1. Such annular arcuate segments may be desirable to preferentially couple to subsets of transverse modes of multimode optical fiber core 100 described by Laguerre polynomials.

In the exemplary embodiment of FIGS. 3A and 3B, annular arcuate segments 300 are longitudinally arranged in a single line parallel to the longitudinal core axis of multimode optical fiber core 100.

It is noted that annular arcuate segments 300 may alternatively be aligned in a helix about the longitudinal core axis, as shown in FIGS. 3E and 3F. In this alternative exemplary embodiment, the annular arcuate segments are desirably longitudinally arranged in the helix with neighboring annular arcuate segments having an angular separation of approximately 360°/n, where n is an integer greater than 1 representing the number of annular arcuate segments in one period of the helix. FIGS. 3E and 3F have four annular arcuate segments per period of the helix and, thus, annular arcuate segments 300 of this exemplary multimode LPFBG may be aligned into four subsets of annular arcuate segments 308, 310, 312, and 314.

Figure 3D:
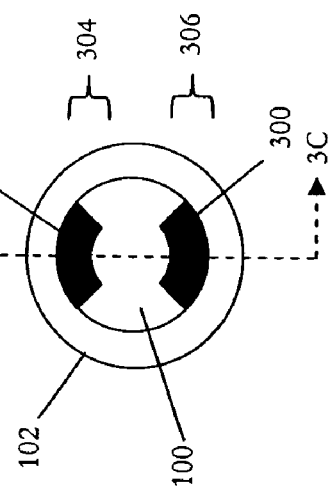
FIG. 3D is an end plan drawing illustrating the exemplary multi-wavelength multimode LPFBG of FIG. 3C.

FIGS. 3C and 3D illustrate an exemplary multi-wavelength multimode LPFBG formed by two subsets of annular arcuate segments 300 located in multimode optical fiber core 100. The annular arcuate segments of subset 304 have a first longitudinal thickness and a first longitudinal pitch within multimode optical fiber core 100. The first longitudinal thickness and pitch of these annular arcuate segments are selected such that the portion of the long period Bragg grating structure formed by subset 304 is preferentially coupled to a first subband of wavelengths of the predetermined wavelength band. The annular arcuate segments of subset 306 have a second longitudinal thickness and a second longitudinal pitch within multimode optical fiber core 100, which are selected such that the portion of the long period Bragg grating structure formed by subset 306 is preferentially coupled to a second subband of wavelengths of the predetermined wavelength band. This second subband of the predetermined wavelength band is desirably different than the first subband, allowing the exemplary multimode LPFBG of FIGS. 3C and 3D to couple two subbands of the predetermined wavelength band. The selection of two subsets of annular arcuate segments in FIGS. 3C and 3D is merely illustrative and is not meant to be limiting.

It is noted that any or all of the index-altered portion outer radius, the index-altered portion inner radius, or the angular extent of the annular arcuate segments may be selected to preferentially couple long period Bragg grating structure 302 to a desired subset of transverse modes of multimode optical fiber core 100. Also, as shown in FIG. 4C, the index-altered portion outer radius, index-altered portion inner radius, and/or angular extent of annular arcuate segments 408 may be varied between different index-altered portions in the longitudinal direction of multimode optical fiber core 100 to preferentially couple exemplary long period Bragg grating structure 410 to a more specific subset of transverse modes of multimode optical fiber core 100.

Figure 5A:
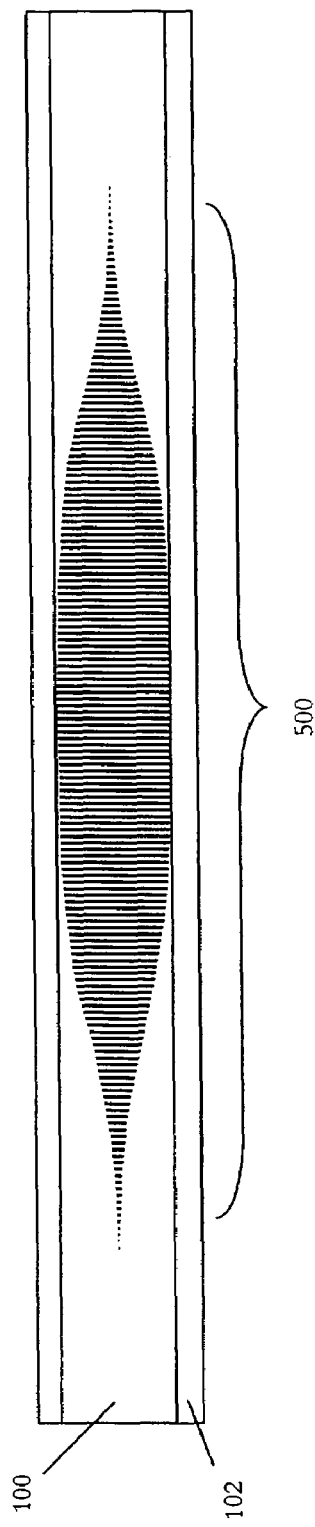
FIGS. 5A and 5B are cut-away side plan drawings illustrating exemplary apodized multimode LPFBG's according to the present invention.
Figure 5B:
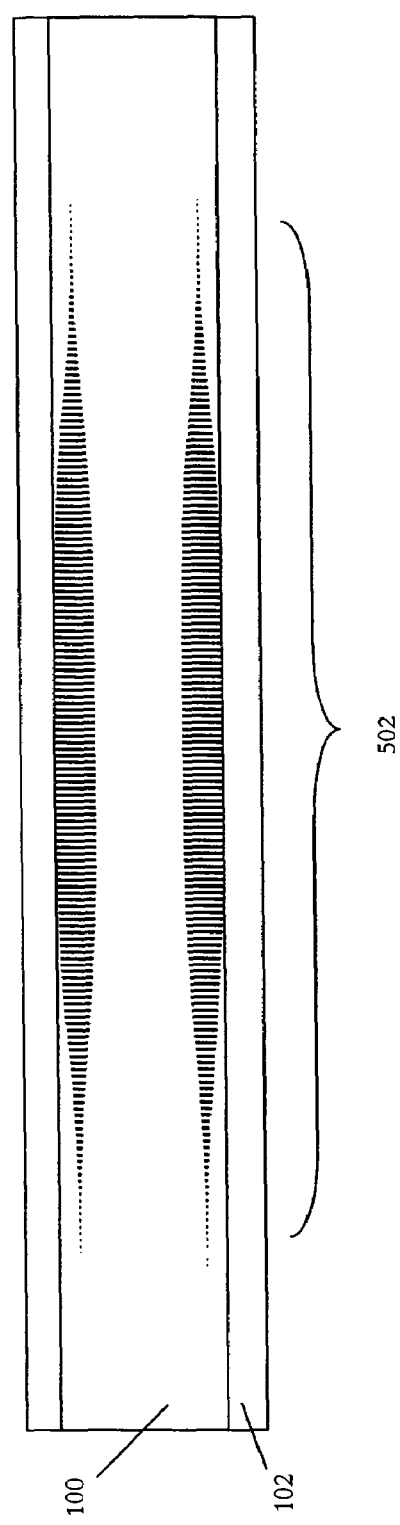

FIGS. 5A and 5B illustrate exemplary apodized multimode LPFBG's. FIG. 5A illustrates exemplary apodized multimode LPFBG which includes a plurality of index-altered portions having cylindrical shape. The index-altered portion radii of these cylindrical index-altered portions are varied between different index-altered portions in the longitudinal direction of multimode optical fiber core 100 such that long period Bragg grating structure 500 is an apodized long period Bragg grating structure. FIG. 5B illustrates similar apodized multimode LPFBG structure 502 formed of either annular or annular arcuate index-altered portions. In this exemplary structure at least one of the index-altered portion outer radii or the index-altered portion inner radii (or the angular extent for angular arcuate segments) of the plurality of index-altered portions are varied between different index-altered portions in the longitudinal direction of multimode optical fiber core 100, desirably forming exemplary apodized long period Bragg grating structure 502.

Figure 6A:
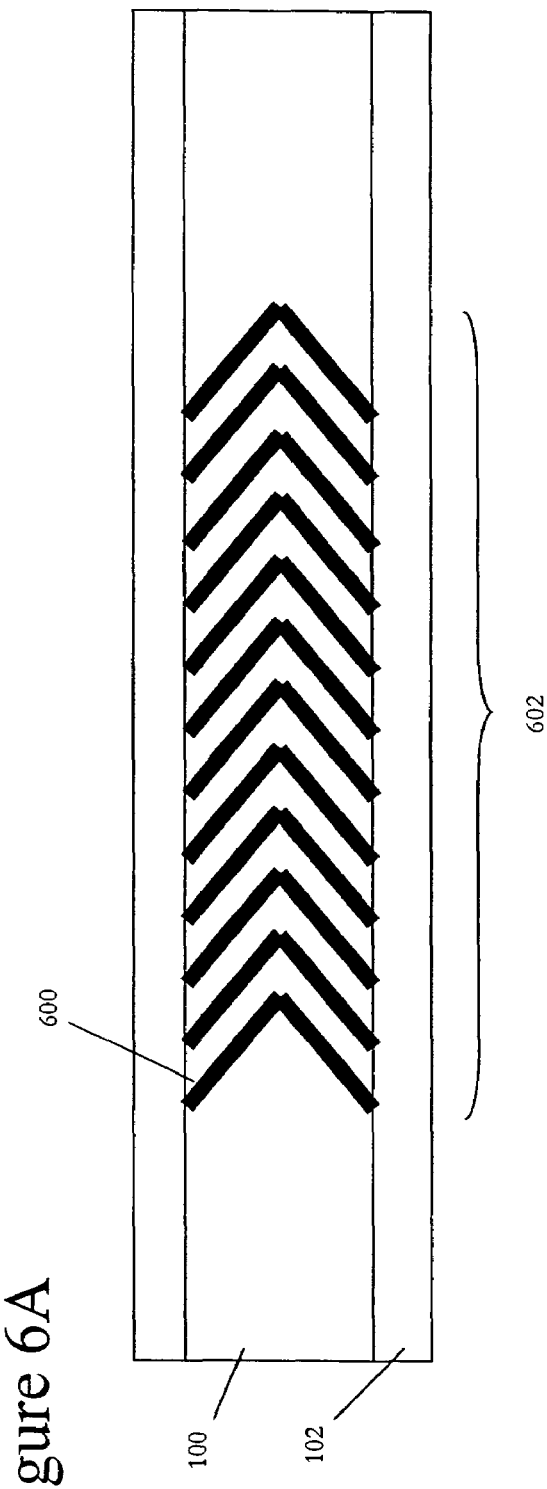
FIGS. 6A and 6B are cut-away side plan drawings illustrating other exemplary multimode LPFBG's according to the present invention.
Figure 6B:
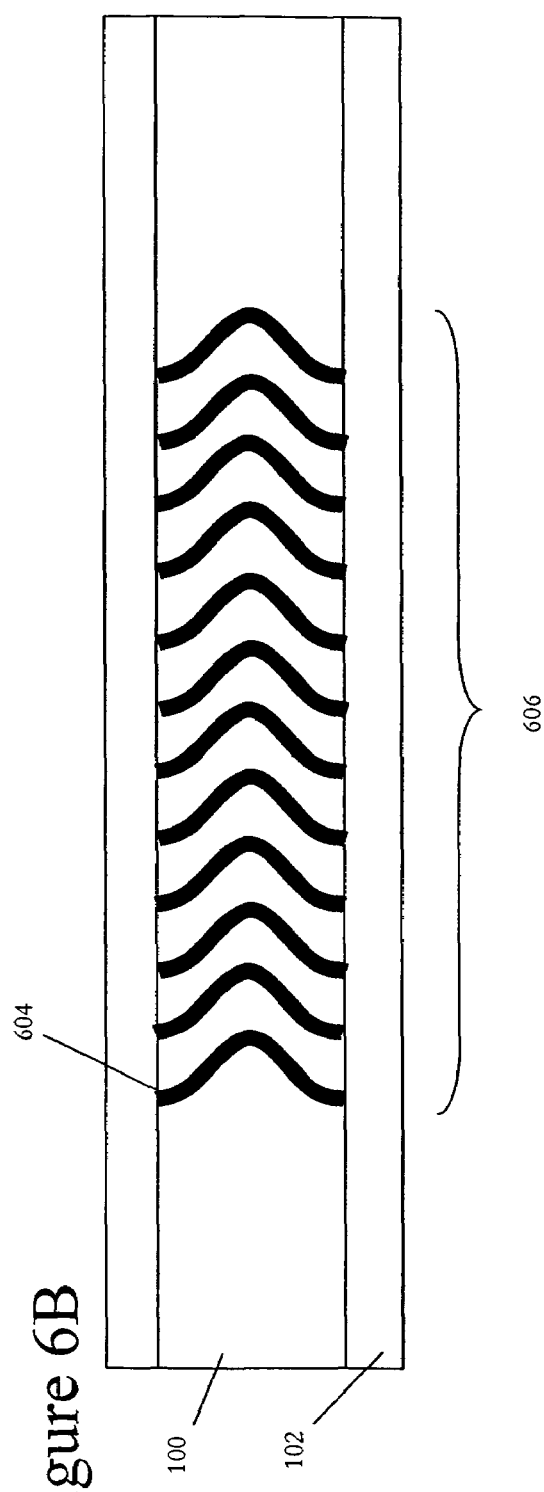

FIGS. 6A and 6B illustrate two additional exemplary multimode LPFBG's. In FIG. 6A, exemplary long period Bragg grating structure 602 is formed by index-altered portions 600 which have transmission surfaces that are conic surfaces, and in FIG. 6B, exemplary long period Bragg grating structure 606 is formed by index-altered portions 604 which have curved transmission surfaces. The curved transmission surfaces of index-altered portions 604 may be aspherical curved, as shown in FIG. 6B, or they may be spherical curved surfaces. Exemplary long period Bragg grating structures, such as those of FIGS. 6A and 6B, in which the index-altered portions have non-planar transmission surfaces may be desirable for converting transverse modes of light propagating in multimode fiber core 100. Such control of the relative power in various transverse modes of the propagating field may desirably improve coupling efficiencies in spliced fiber couplers or other fiber coupling means. Although the exemplary index-altered portions with non-planar transmission surfaces are shown in FIGS. 6A and 6B extending across the width of multimode fiber core 100, it is contemplated that non-planar transmission surface index-altered portions may also be formed with index-altered portion radii less than the fiber core radius and/or may be formed as annuli or annular arcuate segments.

Figure 7:
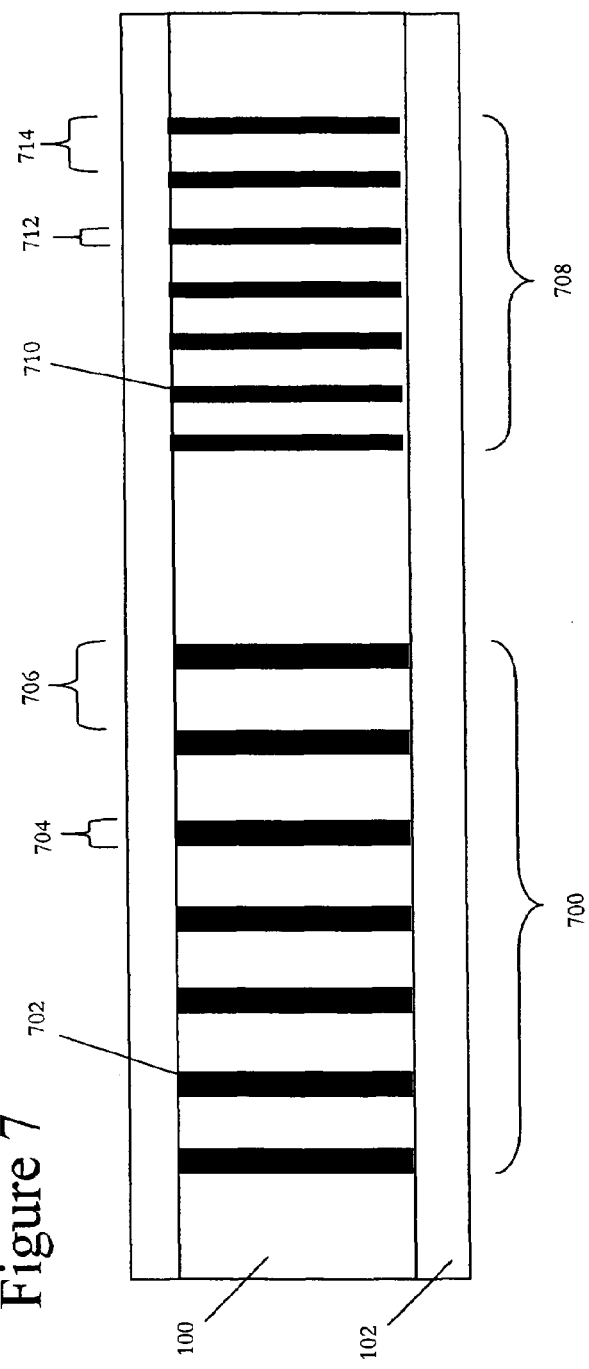
FIG. 7 is a cut-away side plan drawing illustrating an exemplary multi-wavelength multimode LPFBG according to the present invention.

FIGS. 7, 8, 9, and 10 illustrate several exemplary multi-wavelength multimode LPFBG's. FIG. 7 illustrates an exemplary multi-wavelength multimode LPFBG in which the index-altered portions are separated longitudinally into two subsets, index-altered portions 702, which form first portion 700 of the long period Bragg grating structure, and index-altered portions 710, which form second portion 708. Index-altered portions 702 in first portion 700 have a first longitudinal thickness 704 and a first longitudinal pitch 706 within multimode optical fiber core 100 which are selected such that first portion 700 of the long period Bragg grating structure is preferentially coupled to a first subband of wavelengths of the predetermined wavelength band. Index-altered portions 710 in second portion 708 have a second longitudinal thickness 712 and a second longitudinal pitch 714 within multimode optical fiber core 100 which are selected such that second portion 708 of the long period Bragg grating structure is preferentially coupled to a second subband of wavelengths of the predetermined wavelength band, which is different than the first subband of wavelengths. Thus, the resulting long period Bragg grating structure may desirably act as two separate multimode LPFBG's.

It is noted that although FIG. 7 includes only two portions the long period Bragg grating structure coupled to different subbands of wavelengths of the predetermined wavelength band, this choice is merely for simplified illustration and is not limiting. Also, although exemplary subsets of index-altered portions 702 and 710 are shown in FIG. 7 as cylindrical portions extending across the width of multimode fiber core 100, it is contemplated that cylindrical index-altered portions with index-altered portion radii less than the fiber core radius and/or annular or annular arcuate index-altered portions may be used to form exemplary multi-wavelength multimode LPFBG's. The use of these alternative index-altered portions may allow for the various portions of the resulting long period Bragg grating structure to be preferentially coupled to different subsets of transverse modes of the multimode fiber core as well as different subbands of wavelengths. Further the use of annular arcuate index-altered portions in multi-wavelength multimode LPFBG's may allow for a reduction of the longitudinal length of the long period Bragg grating structure, as shown in FIG. 3C.

Figure 8:
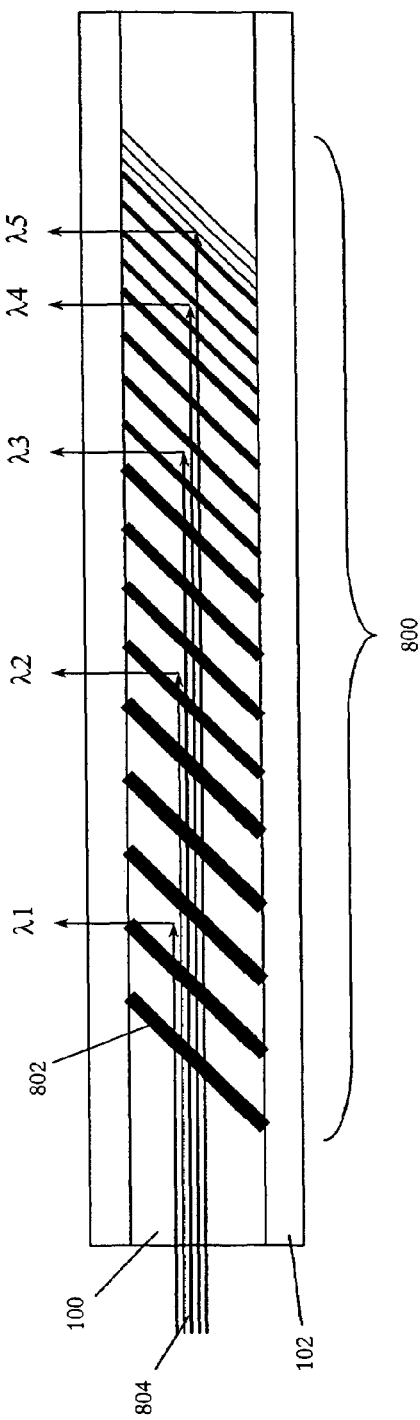
FIG. 8 is a cut-away side plan drawing illustrating an exemplary multi-wavelength multimode LPFBG optical tap according to the present invention.

FIG. 8 illustrates another exemplary multi-wavelength multimode LPFBG 800 which may function as a wavelength dispersive optical tap. In this exemplary embodiment, oblique cylindrical of index-altered portions 802 have tilted planar transmission surfaces. These are planar transmission surfaces are tilted within multimode optical fiber core 100 such that the longitudinal core axis of the optical fiber core has a predetermined angle of incidence with the surfaces. These tilted planar transmission surfaces allow multi-wavelength multimode LPFBG 800 to reflect a predetermined fraction of propagating light 804 through cladding 102 so that the intensity of propagating light 804 may be monitored. It is noted that other long period Bragg grating structures, particularly those with asymmetric index-altered portions and/or index-altered cladding portions (such as those shown in FIGS. 9 and 10), may predictably scatter light through cladding layer 102 and, thus, may also be used to form optical taps in multimode optical fibers.

Additionally, the longitudinal thickness and the longitudinal pitch of oblique cylindrical of index-altered portions 802 is continuously varied along the longitudinal direction of the multimode optical fiber core to form a chirped long period Bragg grating structure. This allows the various wavelengths of propagating light 804 ($\lambda_1$, $\lambda_2$, $\lambda_3$, $\lambda_4$, and $\lambda_5$) to be reflected through cladding 102 at different points by multi-wavelength multimode LPFBG 800. In this way the spectral composition of propagating light 804 may be monitored.

FIG. 9 illustrates an additional exemplary multi-wavelength multimode LPFBG with the two portions of the long period Bragg grating structure formed by different types of index-altered portions. Cylindrical index-altered portions 900 extend from multimode fiber core 100 into cladding layer 102, while annular index-altered cladding portions 902 are formed entirely within cladding layer 102. Index-altered portions 900 and index-altered cladding portions 902 may extend part way through cladding layer 102, as shown in FIG. 9, or all of the way to the outer cladding surface. The extension of index-altered portions into the cladding layer may increase the coupling of some higher order transverse modes to the long period Bragg grating structure, while the formation of index-altered cladding portions entirely within cladding layer 102 may reduce perturbations to lower order transverse modes caused by the long period Bragg grating structure. In single mode fibers, the formation of index-altered cladding portions within the cladding layer may allow coupling of evanescent portions of the propagating light either to reflect a fraction of the light in the predetermined wavelength band back along the optical fiber core or to scatter a fraction of the light in the predetermined wavelength band out of the fiber to form an optical tap. As with index-altered portions formed entirely within a multimode fiber core, various parameters of index-altered portions formed partially or entirely within the cladding layer of an optical fiber may be varied between different index-altered portions in the longitudinal direction of the optical fiber such that the resulting Bragg grating structure is an apodized Bragg grating structure.

It is noted that, because index-altered cladding portions preferentially couple to higher order transverse modes and evanescent portions of the propagating light, the predetermined fraction of light reflected back along the optical fiber core by FBG's formed entirely in the cladding layer may be less than by FBG's formed in the fiber core, but fractions in the range of 0.01% to 10% may be reflected by such Bragg grating structures.

It is contemplated that both annular and annular arcuate index-altered portions may be extended into the cladding layer, as well. Also, index-altered portions formed entirely in multimode fiber core 100 may be combined with index-altered portions extended into cladding layer 102 and/or index-altered cladding portions are formed entirely within cladding layer 102.

Figure 10:
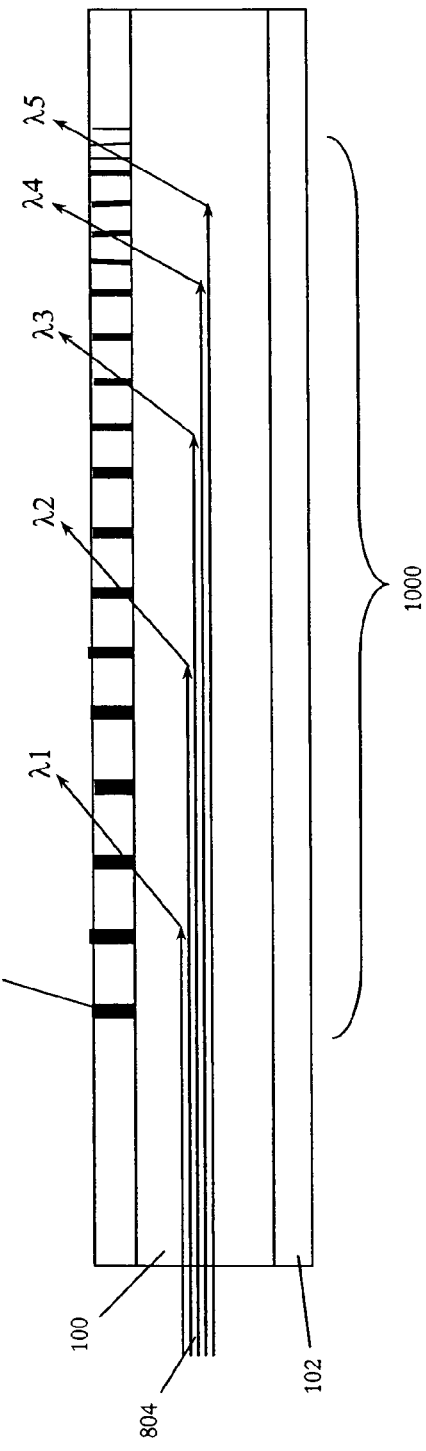
FIG. 10 is a cut-away side plan drawing illustrating an exemplary multi-wavelength multimode FBG optical tap according to the present invention

FIG. 10 illustrates another exemplary chirped multimode LPFBG 1000, formed by index-altered annular arcuate segments 1002 formed entirely within cladding layer 102. As illustrated by the exemplary scattering of propagating light 804 through cladding layer 102, exemplary chirped multimode LPFBG 1000 may be used as a wavelength dispersive optical tap to monitor the spectral composition of propagating light 804.

Figure 11A:
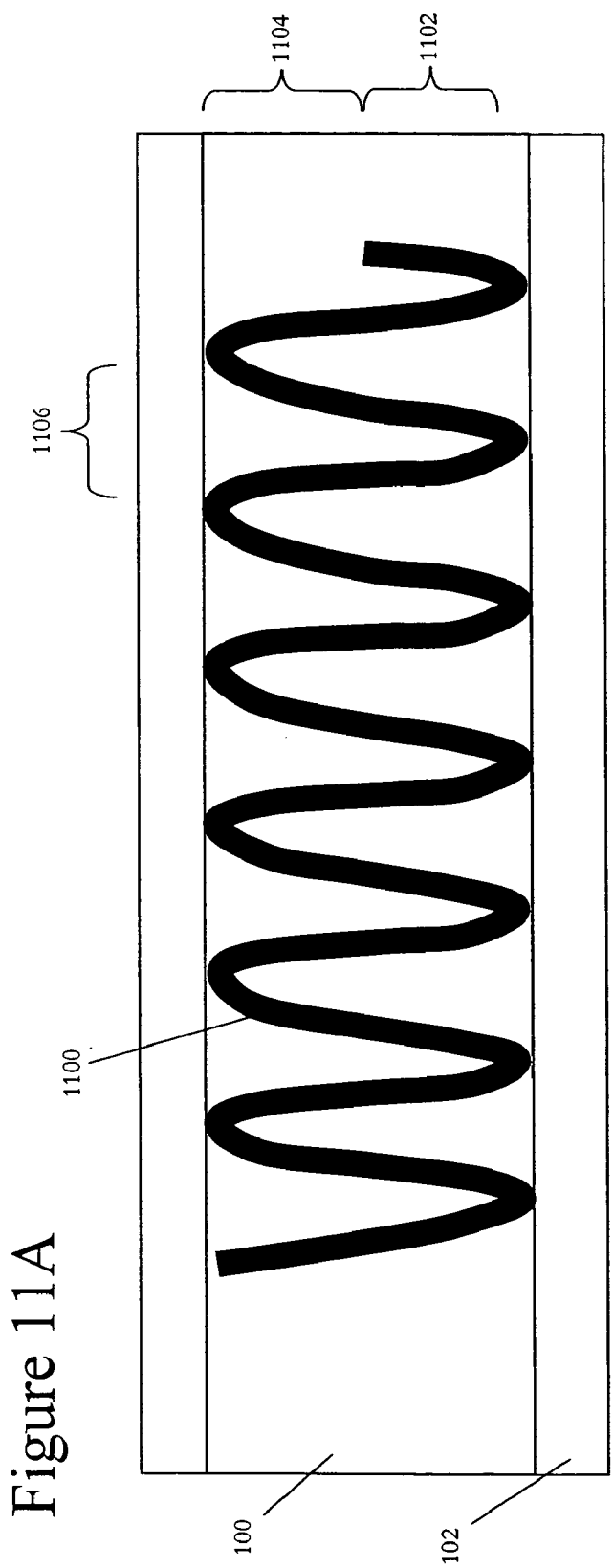
FIG. 11A is a side plan drawing illustrating an exemplary multimode helical FBG according to the present invention.
Figure 11B:
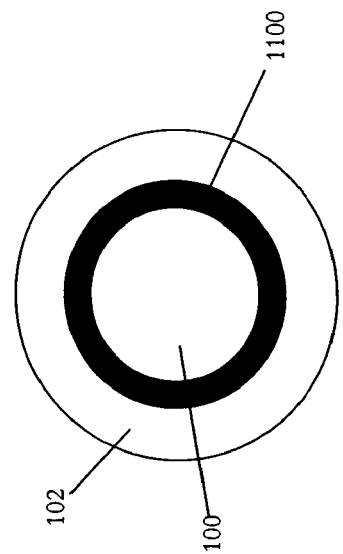
FIG. 11B is an end plan drawing illustrating the exemplary multimode helical FBG of FIG. 11A.

FIGS. 11A and 11B illustrate a multimode optical fiber with a helical FBG formed in multimode optical fiber core 100. Helical index-altered portion 1100 includes: a longitudinal index-altered portion axis which is coaxial to the longitudinal core axis of multimode core 100; index-altered portion outer radius 1104; index-altered portion inner radius 1102; and longitudinal pitch 1106. The index-altered portion outer radius 1104 and index-altered portion inner radius 1102 may varied to preferentially couple the helical FBG to a subset of the transverse modes of multimode optical fiber core 100. Longitudinal pitch 1106 may be altered to selectively couple the helical FBG to a predetermined wavelength band. The longitudinal thickness of helical index-altered portion 1100 may also be varied to further define the predetermined wavelength band coupled to the helical FBG. It is noted that helical index-altered portion 1100 may be formed entirely within multimode optical fiber core 100, as shown in FIGS. 11A and 11B, or may be extended into cladding layer 102. Additionally, a helical FBG may include a helical index-altered cladding portion formed entirely within the cladding layer of either a single mode or multimode optical fiber.

It is contemplated that an exemplary multimode long period fiber Bragg grating may also be formed in which the index-altered portions are arranged in a non-periodic pattern. The resulting long period Bragg grating structure may desirably be formed to have a predetermined transmission spectrum in the predetermined wavelength band for light propagating in the multimode optical fiber core, thus allowing the spectrum of light transmitted through the fiber to be altered to a desired spectral shape.

Another exemplary embodiment of the present invention is an optical fiber with an integral photonic crystal section. These integral photonic crystal structures may be formed using an ultrafast laser machining system alter portions of an optical fiber core in a manner similar to the methods used to form the Bragg grating structures described above. The inclusion of photonic crystal sections within the core of single mode and multimode optical fibers may allow even greater control of the light propagated along these fibers. Additionally, these integral photonic crystal structures may be useful for improving coupling efficiencies between optical fibers and other optical components, including other optical fibers. Further, highly selective wavelength specific couplers may be created using these integral photonic crystal structures. Such couplers may be particularly desirable for use in dense wavelength division multiplexing optical communication systems.

FIGS. 12A and 12B illustrate such exemplary structures formed in the cores of multimode optical fibers. Multimode optical fibers have been selected for the examples for illustrative purposes. In FIG. 12A, multimode optical fiber core 100 includes cylindrical index-altered portions 104, which have an altered index of refraction different from the initial index of refraction of the non-photosensitive material of multimode optical fiber core 100. Cylindrical index-altered portions 104 are arranged within multimode optical fiber core 100 to form one dimensional photonic crystal structure 1200. One dimensional photonic crystal structure 1200 appears similar to long period Bragg grating structure 106 of FIG. 1A, except for the inclusion of defect 1202. (It is also noted that the longitudinal thickness and longitudinal pitch of cylindrical index-altered portions 104 in one dimensional photonic crystal structure 1200 are desirably significantly less than those in long period Bragg grating structure 106, although this is not clear in the scaled Figures.)

FIG. 12B illustrates an exemplary multimode optical fiber with three dimensional photonic crystal structure 1204 formed within multimode fiber core 100. Exemplary three dimensional photonic crystal structure 1204 is formed of large number of regularly spaced spherical index-altered portions 1206. The lattice formed by spherical index-altered portions 1206 is interrupted by defects 1208, which occur at regular intervals.

It is noted that, although both defect 1202 in one dimensional photonic crystal structure 1200 and defects 1208 in three dimensional photonic crystal structure 1204 result from a missing index-altered portion, other types of defects may be formed in these exemplary photonic crystal structures, such as an additional index-altered portion, an index-altered portion having a different shape, or change in the period structure of the photonic crystal. It is also noted that exemplary two dimensional photonic crystal structures may be formed in multimode optical fiber cores according to this exemplary embodiment of the present invention.

A further exemplary embodiment of the present invention is an optical fiber with integral diffractive coupling optics. These integral diffractive coupling optics structures may also be formed using an ultrafast laser machining system to alter portions of the optical fiber core near the input and output surfaces of the fiber. The inclusion of integral diffractive coupling optics within the core of optical fibers may greatly improve coupling efficiencies between optical fibers and other optical components. They may also allow for space saving solutions in fiber optics systems by reducing, or eliminating, the need for free space coupling optics within these systems. As in the exemplary embodiments of FIGS. 12A and 12B, multimode optical fibers have been selected in FIGS. 13A-F for illustrative purposes.

Figure 13B:
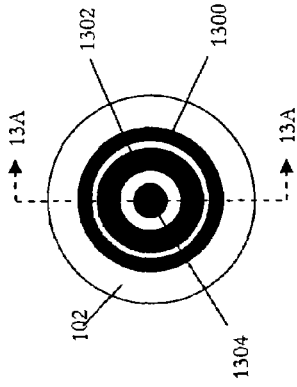
FIG. 13B is an end plan drawing illustrating the exemplary multimode fiber with integral diffractive coupling optics of FIG. 13A.
Figure 13A:
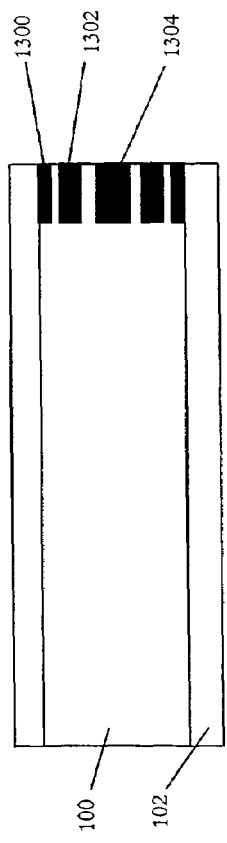
FIG. 13A is a cut-away side plan drawing illustrating an exemplary multimode fiber with integral diffractive coupling optics according to the present invention cut along line 13A of FIG. 13B.

FIGS. 13A and 13B illustrate one exemplary multimode optical fiber with integral diffractive coupling optics. In this example, multimode optical fiber core 100 includes a coupling section adjacent to the substantially planar end surface. This coupling section is formed by concentric annular index-altered portions 1300 and 1302 and cylindrical index-altered portion 1304 which have an altered index of refraction different from the initial index of refraction of the non-photosensitive material of multimode fiber core 100. Concentric annular index-altered portions 1300 and 1302 and cylindrical index-altered portion 1304 are arranged to form a circular two dimensional diffractive optical lens. This lens may be spherical or aspherical depending on the radii of the index-altered portions. It is noted that the focal length of this exemplary circular two dimensional diffractive optical lens is wavelength dependent. Thus, such lenses may not be desirable for broad bandwidth applications.

Figure 13D:
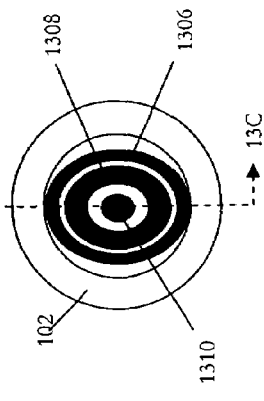
FIG. 13D is an end plan drawing illustrating the exemplary multimode fiber with integral diffractive coupling optics of FIG. 13C.
Figure 13C:
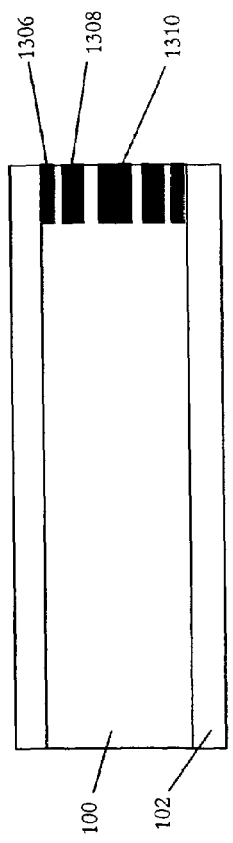
FIG. 13C is a cut-away side plan drawing illustrating an alternative exemplary multimode fiber with integral diffractive coupling optics according to the present invention cut along line 13C of FIG. 13D.

FIGS. 13C and 13D illustrate another exemplary multimode optical fiber with an integral elliptical two dimensional diffractive optical lens. In this example, the coupling section is formed by concentric elliptical annular index-altered portions 1306 and 1308 and elliptical index-altered portion 1310 which have an altered index of refraction different from the initial index of refraction of the non-photosensitive material of multimode fiber core 100. This lens may be designed to have a small ellipticity of a large ellipticity depending on the desired ratio of the cone angles in the X and Y directions.

Figure 13F:
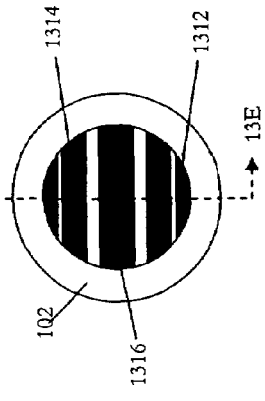
FIG. 13F is an end plan drawing illustrating the exemplary multimode fiber with integral diffractive coupling optics of FIG. 13E.
Figure 13E:
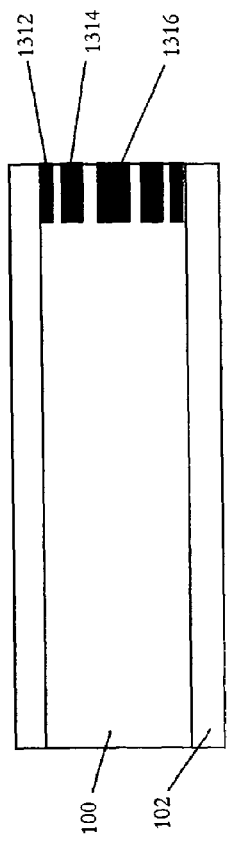
FIG. 13E is a cut-away side plan drawing illustrating another exemplary multimode fiber with integral diffractive coupling optics according to the present invention cut along line 13E of FIG. 13F.

FIGS. 13E and 13F illustrate a further exemplary multimode optical fiber with an integral one dimensional diffractive optical lens. This exemplary integral coupling optics section may function as a cylindrical lens. Such lens may be particularly desirable for coupling light from semiconductor lasers into the multimode optical fiber. The coupling section of FIGS. 13E and 13F is formed in multimode fiber core 100 by parallel linear index-altered portions 1312, 1314, and 1316. Parallel linear index-altered portions 1312, 1314, and 1316 are sized and arranged such that the integral diffractive coupling optics formed in the coupling section of multimode optical fiber core 100 is a one dimensional diffractive optical lens. It is noted that parallel linear index-altered portions 1312, 1314, and 1316 may also form a transmission grating, if equally sized and spaced, allowing various wavelengths of light propagating in the multimode optical fiber to by diffracted in separate directions.

The various multimode optical fiber structures described above may be used to design a number of exemplary optical devices, one example of which is a wavelength stabilized, high power, uncooled laser source. Operating a laser in an uncooled mode may be desirable to reduce power consumption used to cool the laser, as well as to reduce the feedback circuitry used to control the laser's temperature. Unfortunately, such uncooled operation may cause difficulties with maintaining a constant output wavelength of the laser. This is due to the thermal dependence of the output wavelength of the laser. These difficulties may be magnified in high power applications where large quantities of heat are generated by the laser and the temperature may vary over a large range.

One method of overcoming these difficulties is the use of an external optical cavity to lock the output wavelength of the laser by coupling light resonant with the external cavity back into the laser. Optically coupling the laser and the external cavity may necessitate additional optics, leading to added complexity and increased power loss. Such external cavities also are desirably thermally isolated or are designed to have low temperature dependence.

Figure 14:
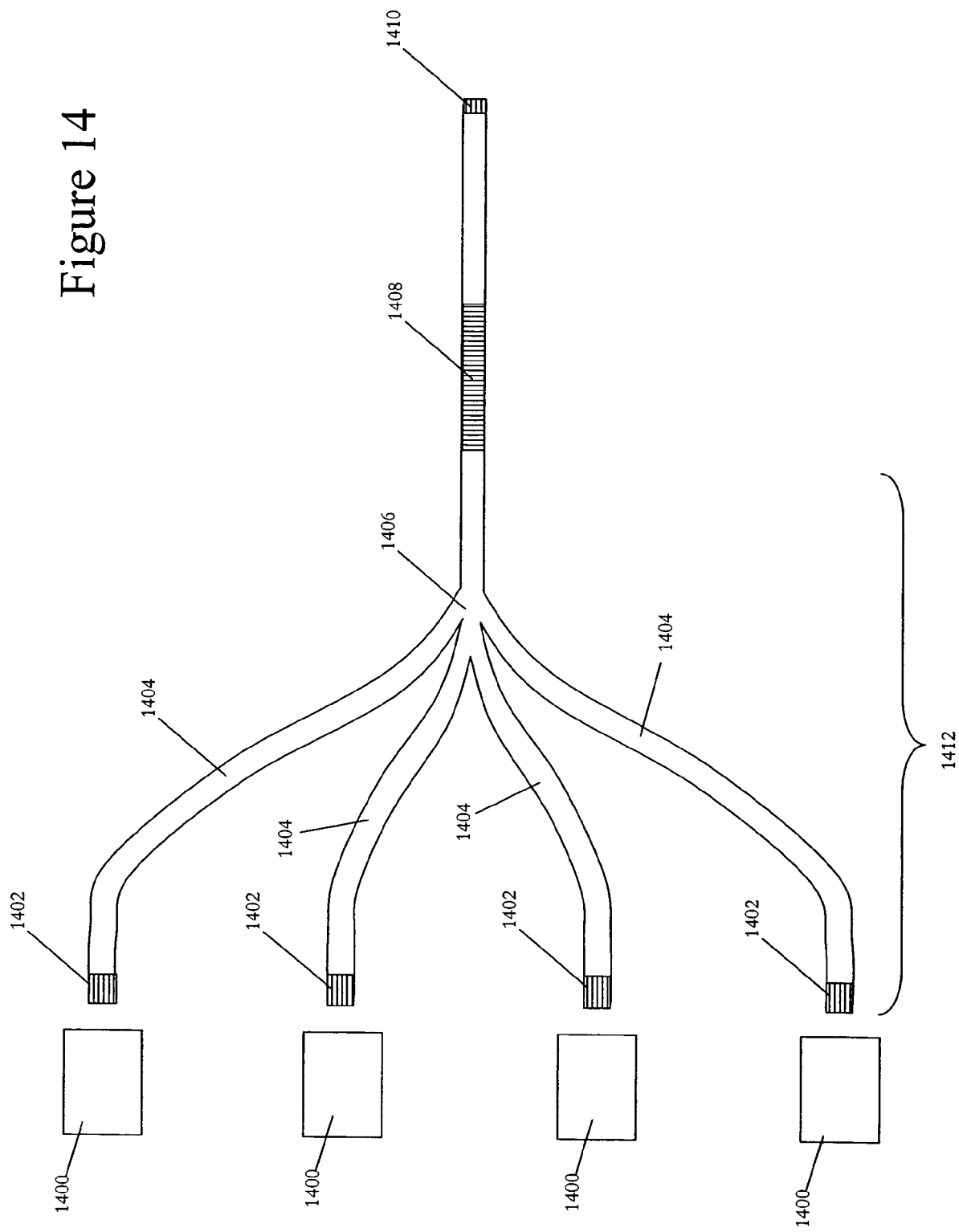
FIG. 14 is a block schematic diagram illustrating an exemplary wavelength stabilized, high power, uncooled laser source according to the present invention.

FIG. 14 illustrates an exemplary wavelength stabilized, high power, uncooled laser source, which uses exemplary multimode LPFBG 1408 to lock the laser output wavelength. An exemplary type of high power laser for which the exemplary embodiment of FIG. 14 may be particularly desirable is a continuous wave semiconductor laser. This exemplary wavelength stabilized, high power, uncooled laser source includes four high power lasers 1400. These four lasers are optically coupled into four coupling multimode optical fibers 1404, which are optically coupled to a single multimode optical fiber at fiber coupler 1406. Fiber coupler 1406 is desirably a low loss fiber coupler, such as a star coupler or a spliced fiber coupler, as shown in FIG. 14. It is noted that multimode optical fibers are desirable in this application for their high power handling capabilities.

The single multimode optical fiber desirably includes a low loss multimode core formed of a non-photosensitive material in which a plurality of index-altered portions, having an altered index of refraction, have been formed using an ultrafast laser machining system. The index-altered portions are arranged within the non-photosensitive material of the multimode core to form long period Bragg grating structure 1408. This long period Bragg grating structure is desirably adapted to reflect a predetermined fraction of light in the desired wavelength band back along the optical fibers and into high power lasers 1400, thereby locking the output wavelength band of the wavelength stabilized, high power, uncooled laser source to the desired wavelength band. Long period Bragg grating structure 1408 may desirably reflect up to 99.9%, preferably 3% to 20%, of the light provided by the laser in the desired wavelength band back into the laser.

It is noted that it may be desirable for high power lasers 1400 and the multimode optical fibers of the exemplary system to be substantially thermally uncoupled, or, alternatively, for the non-photosensitive material of the multimode core of the single multimode optical fiber to have a coefficient of thermal expansion low enough to prevent an undesirable shift in the desired wavelength band reflected by long period Bragg grating structure 1408 during operation. Another approach to reduce heating of long period Bragg grating structure 1408 during operation of high power lasers 1400 is to provide thermal buffering section 1412 between the laser coupling surface and long period Bragg grating section 1408.

This exemplary external cavity wavelength locker includes only a small number of relatively simple optical components. Also, by utilizing low loss multimode optical fibers with multimode cores formed of non-photosensitive materials, power loss in the system is kept low. Additionally, coupling losses may be reduced further by forming additional exemplary diffractive structures in the multimode optical fiber cores, such as coupling sections 1402, similar to those shown in FIGS. 13A-F, adjacent to the laser coupling surfaces of coupling multimode optical fibers 1404 and output section 1410 adjacent to the output surface of the single multimode optical fiber. Because these diffractive structures are formed within the multimode optical fibers, they may have lower losses than the free standing optical elements that they may replace.

It is noted that the exemplary wavelength stabilized, high power, uncooled laser source shown in FIG. 14 includes four high power lasers 1400. The choice of four lasers is only exemplary and one skilled in the art may understand that other numbers of high power lasers may be used in an exemplary wavelength stabilized, high power, uncooled laser source according to the present invention. This may include a system with a single high power laser, in which case, coupling multimode optical fibers 1404 and fiber coupler 1406 may be omitted from the laser source without affecting its operation.

Further, long period Bragg grating structure 1408 may include any of the alternative embodiments described above with reference to FIGS. 1A-11B. In particular, long period Bragg grating structure 1408 may include multiple subsets of index-altered portions preferentially coupled to different subband of wavelengths of the predetermined wavelength band and/or different transverse modes of the laser light propagating in the multimode fiber in which long period Bragg grating structure 1408 is formed.

Although many exemplary embodiments of the invention are described in terms of forming structures in circular optical fibers, it is contemplated that the exemplary structures described herein may be formed in optical waveguides of different cross-sectional shaped, including elliptical polarization-maintaining optical fibers.

Although illustrated and described above with reference to certain specific embodiments, the present invention is nevertheless not intended to be limited to the details shown. Rather, various modifications may be made in the details within the scope and range of equivalents of the claims and without departing from the invention.

What is claimed is:

1. A multimode long period fiber Bragg grating for a predetermined wavelength band, comprising:
    a multimode optical fiber core formed of a non-photosensitive material having an initial index of refraction, the multimode optical fiber core includes;
    a substantially cylindrical surface;
    a longitudinal core axis;
    a core radius; and
    a plurality of index-altered portions having an altered index of refraction different from the initial index of refraction;

wherein;
each of the plurality of index-altered portions of the multimode optical fiber core has a first transmission surface and second transmission surface substantially parallel to the first transmission surface; and
the plurality of index-altered portions are arranged within the non-photosensitive material of the multimode optical fiber core such that the first transmission surface of one portion of the plurality of index-altered portions is substantially parallel to the second transmission surface of a neighboring portion of the plurality of index-altered portions to form a long period Bragg grating structure.

2. A multimode long period fiber Bragg grating according to claim 1, wherein the non-photosensitive material of the multimode optical fiber core includes at least one of: fused silica; borosilicate; quartz; zirconium fluoride; silver halide; chalcogenide glass; optical plastic; clear fused quartz; aluminosilicate; polymethylmeth-acrylate; polystyrene; acrylic; or arsenic trioxide.

3. A multimode long period fiber Bragg grating according to claim 1, wherein the core radius of the multimode optical fiber core is in the range of about 10 µm to about 200 µm.

4. A multimode long period fiber Bragg grating according to claim 3, wherein the core radius of the multimode optical fiber core is in the range of about 25 µm to about 32 µm.

5. A multimode long period fiber Bragg grating according to claim 1, wherein the altered index of refraction of the plurality of index-altered portions is altered by selective irradiation of the non-photosensitive material by pulses of ultrafast laser light.

6. A multimode long period fiber Bragg grating according to claim 1, wherein:
the non-photosensitive material of the multimode optical fiber core has an initial crystallinity; and
the plurality of index-altered portions have an altered crystallinity which is less ordered than the initial crystallinity of the non-photosensitive material.

7. A multimode long period fiber Bragg grating according to claim 6, wherein the altered crystallinity of the plurality of index-altered portions is altered by selective irradiation of the non-photosensitive material by pulses of ultrafast laser light.

8. A multimode long period fiber Bragg grating according to claim 1, wherein the first transmission surfaces and the second transmission surfaces of the plurality of index-altered portions are planar surfaces.

9. A multimode long period fiber Bragg grating according to claim 8, wherein the longitudinal core axis of the multimode optical fiber core has a predetermined angle of incidence with planes of the first transmission surfaces and the second transmission surfaces of the plurality of index-altered portions.

10. A multimode long period fiber Bragg grating according to claim 8, wherein the longitudinal core axis of the multimode optical fiber core is substantially normal to planes of the first transmission surface and the second transmission surface of each of the plurality of index-altered portions.

11. A multimode long period fiber Bragg grating according to claim 1, wherein the first transmission surfaces and the second transmission surfaces of the plurality of index-altered portions are conic surfaces.

12. A multimode long period fiber Bragg grating according to claim 1, wherein the first transmission surfaces and the second transmission surfaces of the plurality of index-altered portions are spherical curved surfaces.

13. A multimode long period fiber Bragg grating according to claim 1, wherein the first transmission surfaces and the second transmission surfaces of the plurality of index-altered portions are aspherical curved surfaces.

14. A multimode long period fiber Bragg grating according to claim 1, wherein each of the plurality of index-altered portions has a cylindrical shape including:
a longitudinal index-altered portion axis coaxial to the longitudinal core axis of the multimode optical fiber core; and
an index-altered portion radius.

15. A multimode long period fiber Bragg grating according to claim 14, wherein the index-altered portion radius of each of the plurality of index-altered portions is equal to the core radius of the multimode optical fiber core.

16. A multimode long period fiber Bragg grating according to claim 14, wherein the index-altered portion radius of each of the plurality of index-altered portions is less than the core radius of the multimode optical fiber core, the index-altered portion radius selected to preferentially couple the long period Bragg grating structure to a subset of transverse modes of the multimode optical fiber core.

17. A multimode long period fiber Bragg grating according to claim 14, wherein the index-altered portion radii of the plurality of index-altered portions varies between different index-altered portions in the longitudinal direction of the multimode optical fiber core such that the long period Bragg grating structure formed by the plurality of index-altered portions is an apodized long period Bragg grating structure.

18. A multimode long period fiber Bragg grating according to claim 1, wherein each of the plurality of index-altered portions has annular shape including:
a longitudinal index-altered portion axis coaxial to the longitudinal core axis of the multimode optical fiber core;
an index-altered portion outer radius; and
an index-altered portion inner radius which is less than the index-altered portion outer radius.

19. A multimode long period fiber Bragg grating according to claim 18, wherein:
the index-altered portion outer radius of each of the plurality of index-altered portions is equal to the core radius of the multimode optical fiber core; and
the index-altered portion inner radius of each of the plurality of index-altered portions is selected to preferentially couple the long period Bragg grating structure to a subset of transverse modes of the multimode optical fiber core.

20. A multimode long period fiber Bragg grating according to claim 18, wherein:
the index-altered portion outer radius of each of the plurality of index-altered portions is less than the core radius of the multimode optical fiber core; and
the index-altered portion outer radius and the index-altered portion inner radius of each of the plurality of index-altered portions are selected to preferentially couple the long period Bragg grating structure to a subset of transverse modes of the multimode optical fiber core.

21. A multimode long period fiber Bragg grating according to claim 18, wherein at least one of the index-altered portion outer radii or the index-altered portion inner radii of the plurality of index-altered portions varies between different index-altered portions in the longitudinal direction of the multimode optical fiber core such that the long period Bragg grating structure is preferentially coupled to a subset of transverse modes of the multimode optical fiber core.

22. A multimode long period fiber Bragg grating according to claim 18, wherein at least one of the index-altered portion outer radii or the index-altered portion inner radii of the plurality of index-altered portions varies between different index-altered portions in the longitudinal direction of the multimode optical fiber core such that the long period Bragg grating structure formed by the plurality of index-altered portions is an apodized long period Bragg grating structure.

23. A multimode long period fiber Bragg grating according to claim 1, wherein each of the plurality of index-altered portions is an annular arcuate segment including:
    an index-altered portion outer radius;
    an index-altered portion inner radius which is less than the index-altered portion outer radius; and
    an angular extent less than 180° around the longitudinal core axis of the multimode optical fiber core.

24. A multimode long period fiber Bragg grating according to claim 23, wherein:
    the index-altered portion outer radius of each of the plurality of index-altered portions is equal to the core radius of the multimode optical fiber core; and
    the index-altered portion inner radius and the angular extent of each of the plurality of index-altered portions are selected to preferentially couple the long period Bragg grating structure to a subset of transverse modes of the multimode optical fiber core.

25. A multimode long period fiber Bragg grating according to claim 23, wherein:
    the index-altered portion outer radius of each of the plurality of index-altered portions is less than the core radius of the multimode optical fiber core; and
    the index-altered portion outer radius, the index-altered portion inner radius, and the angular extent of each of the plurality of index-altered portions are selected to preferentially couple the long period Bragg grating structure to a subset of transverse modes of the multimode optical fiber core.

26. A multimode long period fiber Bragg grating according to claim 23, wherein at least one of the index-altered portion outer radii, the index-altered portion inner radii, or the angular extent of the plurality of index-altered portions varies between different index-altered portions in the longitudinal direction of the multimode optical fiber core such that the long period Bragg grating structure is preferentially coupled to a subset of transverse modes of the multimode optical fiber core.

27. A multimode long period fiber Bragg grating according to claim 23, wherein at least one of the index-altered portion outer radii, the index-altered portion inner radii, or the angular extent of the plurality of index-altered portions varies between different index-altered portions in the longitudinal direction of the multimode optical fiber core such that the long period Bragg grating structure formed by the plurality of index-altered portions is an apodized long period Bragg grating structure.

28. A multimode long period fiber Bragg grating according to claim 23, wherein the angular extent of the plurality of index-altered portions is equal to approximately 360°/n, where n is an integer greater than 1.

29. A multimode long period fiber Bragg grating according to claim 23, wherein:
    the angular extent of the plurality of index-altered portions is less than 360°/n, where n is an integer greater than 1;
    the long period Bragg grating structure formed by the plurality of index-altered portions includes n subsets of annular arcuate segments;
    each subset of annular arcuate segments being longitudinally aligned in a line parallel to the longitudinal core axis of the multimode optical fiber core at a subset angle, the subset angles of neighboring subsets of annular arcuate segments having an angular separation of approximately 360°/n.

30. A multimode long period fiber Bragg grating according to claim 29, wherein:
    a first subset of annular arcuate segments have a first longitudinal thickness and a first longitudinal pitch within the multimode optical fiber core selected such that a first portion of the long period Bragg grating structure formed by the first subset of annular arcuate segments is preferentially coupled to a first subband of wavelengths of the predetermined wavelength band; and
    a second subset of annular arcuate segments have a second longitudinal thickness and a second longitudinal pitch within the multimode optical fiber core selected such that a second portion of the long period Bragg grating structure formed by the second subset of annular arcuate segments is preferentially coupled to a second subband of wavelengths of the predetermined wavelength band which is different than the first subband of wavelengths of the predetermined wavelength band.

31. A multimode long period fiber Bragg grating according to claim 23, wherein the plurality of annular arcuate segments are longitudinally arranged in a helix within the multimode optical fiber core, angles of neighboring annular arcuate segments having an angular separation of approximately 360°/n, where n is an integer greater than 1.

32. A multimode long period fiber Bragg grating according to claim 23, wherein the plurality of annular arcuate segments are longitudinally arranged in a line parallel to the longitudinal core axis of the multimode optical fiber core.

33. A multimode long period fiber Bragg grating according to claim 1, wherein:
    the plurality of index-altered portions are arranged within the non-photosensitive material of the multimode optical fiber core with a longitudinal pitch and each index-altered portion has a longitudinal thickness; and
    the longitudinal thickness and the longitudinal pitch selected such that the long period Bragg grating structure is preferentially coupled to the predetermined wavelength band.

34. A multimode long period fiber Bragg grating according to claim 33, wherein the longitudinal thickness of the plurality of index-altered portions is less than or equal to half of the longitudinal pitch.

35. A multimode long period fiber Bragg grating according to claim 33, wherein the longitudinal pitch of the plurality of index-altered portions is greater than a longest wavelength of the predetermined wavelength band in the material.

36. A multimode long period fiber Bragg grating according to claim 33, wherein the longitudinal thickness of the plurality of index-altered portions is in a range of 10 nm to 20 µm.

37. A multimode long period fiber Bragg grating according to claim 36, wherein the longitudinal thickness of the plurality of index-altered portions is in a range of 1 µm to 10 µm.

38. A multimode long period fiber Bragg grating according to claim 33, wherein the longitudinal pitch of the plurality of index-altered portions is in a range of 1 µm to 500 µm.

39. A multimode long period fiber Bragg grating according to claim 38, wherein the longitudinal pitch of the plurality of index-altered portions is in a range of 15 µm to 20 µm.

40. A multimode long period fiber Bragg grating according to claim 33, wherein the longitudinal pitch of the plurality of index-altered portions varies between different index-altered portions in the longitudinal direction of the multimode optical fiber core such that the long period Bragg grating structure formed by the plurality of index-altered portions is a chirped long period Bragg grating structure.

41. A multimode long period fiber Bragg grating according to claim 1, wherein:
the long period Bragg grating structure formed by the plurality of index-altered portions includes n subsets of index-altered portions;
each subset of index-altered portions being longitudinally aligned in a line parallel to the longitudinal core axis of the multimode optical fiber core;
a first subset of index-altered portions have a first longitudinal thickness and a first longitudinal pitch within the multimode optical fiber core selected such that a first portion of the long period Bragg grating structure formed by the first subset of index-altered portions is preferentially coupled to a first subband of wavelengths of the predetermined wavelength band; and
a second subset of index-altered portions have a second longitudinal thickness and a second longitudinal pitch within the multimode optical fiber core selected such that a second portion of the long period Bragg grating structure formed by the second subset of index-altered portions is preferentially coupled to a second subband of wavelengths of the predetermined wavelength band which is different than the first subband of wavelengths.

42. A multimode long period fiber Bragg grating according to claim 1, wherein the long period Bragg grating structure formed by the plurality of index-altered portions reflects a predetermined fraction of light in the predetermined wavelength band propagating in the multimode optical fiber core back along the multimode optical fiber core.

43. A multimode long period fiber Bragg grating according to claim 42, wherein the predetermined fraction of light reflected back along the multimode optical fiber core is up to 99.9%.

44. A multimode long period fiber Bragg grating according to claim 43, wherein the predetermined fraction of light reflected back along the multimode optical fiber core is in a range of 3% to 20%.

45. A multimode long period fiber Bragg grating according to claim 1, wherein the long period Bragg grating structure formed by the plurality of index-altered portions scatters a predetermined fraction of light in the predetermined wavelength band propagating in the multimode optical fiber core out of a portion of the substantially cylindrical surface of the multimode optical fiber core to form an optical tap.

46. A multimode long period fiber Bragg grating according to claim 1, wherein:
the plurality of index-altered portions are arranged in a non-periodic pattern;
the long period Bragg grating structure formed by the plurality of index-altered portions has a predetermined transmission spectrum in the predetermined wavelength band for light propagating in the multimode optical fiber core.

47. A multimode long period fiber Bragg grating according to claim 1, further comprising a cladding layer formed on the substantially cylindrical surface of the multimode optical fiber core, the cladding layer having a cladding index of refraction lower than the initial index of refraction of the non-photosensitive material of the multimode optical fiber core.

48. A multimode long period fiber Bragg grating according to claim 47, wherein the cladding layer includes a plurality of index-altered cladding portions.

49. A fiber Bragg grating for a predetermined wavelength band, comprising:
an optical fiber core having a core index of refraction;
a substantially cylindrical surface;
a longitudinal core axis; and
a core radius; and
a cladding layer formed of a non-photosensitive material on the substantially cylindrical surface of the optical fiber core, the non-photosensitive material of the cladding layer having an initial cladding index of refraction lower than the core index of refraction of the optical fiber core, the cladding layer includes;
an outer cladding radius; and
a plurality of index-altered portions having an altered index of refraction different from the initial cladding index of refraction;
wherein;
each of the plurality of index-altered portions of the cladding layer extends into the cladding layer from the substantially cylindrical surface of the optical fiber core;
the index-altered portion outer radii of the plurality of index-altered portions vary between different index-altered portions in the longitudinal direction of the optical fiber core; and
the plurality of index-altered portions are arranged within the non-photosensitive material of the cladding layer to form an apodized Bragg grating structure.

50. A fiber Bragg grating according to claim 49, wherein the non-photosensitive material of the cladding layer includes at least one of: fused silica; borosilicate; quartz; zirconium fluoride; silver halide; chalcogenide glass; optical plastic; clear fused quartz; aluminosilicate; polymethylmeth-acrylate; polystyrene; acrylic; or arsenic trioxide.

51. A fiber Bragg grating according to claim 49, wherein the altered index of refraction of the plurality of index-altered portions is altered by selective irradiation of the non-photosensitive material by pulses of ultrafast laser light.

52. A fiber Bragg grating according to claim 49, wherein:
the non-photosensitive material of the cladding layer has an initial crystallinity; and
the plurality of index-altered portions have an altered crystallinity which is less than the initial crystallinity of the non-photosensitive material.

53. A fiber Bragg grating according to claim 52, wherein the altered crystallinity of the plurality of index-altered portions is altered by selective irradiation of the non-photosensitive material by pulses of ultrafast laser light.

54. A fiber Bragg grating according to claim 49, wherein each of the plurality of index-altered portions has annular shape including:
a longitudinal index-altered portion axis coaxial to the longitudinal core axis of the optical fiber core;

an index-altered portion inner radius which is equal to the core radius of the optical fiber core; and an index-altered portion outer radius which is less than or equal to the outer cladding radius of the cladding layer.

55. A fiber Bragg grating according to claim 54, wherein:
the Bragg grating structure formed by the plurality of index-altered portions includes n subsets of index-altered portions;
a first subset of index-altered portions have a first longitudinal thickness and a first longitudinal pitch within the cladding layer selected such that a first portion of the Bragg grating structure formed by the first subset of index-altered portions is preferentially coupled to a first subband of wavelengths of the predetermined wavelength band; and
a second subset of index-altered portions have a second longitudinal thickness and a second longitudinal pitch within the cladding selected such that a second portion of the Bragg grating structure formed by the second subset of index-altered portions is preferentially coupled to a second subband of wavelengths of the predetermined wavelength band which is different than the first subband of wavelengths.

56. A fiber Bragg grating according to claim 49, wherein:
the plurality of index-altered portions are arranged within the non-photosensitive material of the cladding layer with a longitudinal pitch and each index-altered portion has a longitudinal thickness; and
the longitudinal thickness and the longitudinal pitch selected such that the Bragg grating structure is preferentially coupled to the predetermined wavelength band.

57. A fiber Bragg grating according to claim 56, wherein the longitudinal thickness of the plurality of index-altered portions is less than or equal to half of the longitudinal pitch.

58. A fiber Bragg grating according to claim 56, wherein the longitudinal pitch of the plurality of index-altered portions varies between different index-altered portions in the longitudinal direction of the optical fiber core such that the Bragg grating structure formed by the plurality of index-altered portions is a chirped Bragg grating structure.

59. A fiber Bragg grating according to claim 49, wherein the Bragg grating structure formed by the plurality of index-altered portions reflects a predetermined fraction of light in the predetermined wavelength band propagating in the optical fiber core back along the optical fiber core.

60. A fiber Bragg grating according to claim 59, wherein the predetermined fraction of light reflected back along the optical fiber core is in a range of 0.01% to 10%.

61. A fiber Bragg grating according to claim 49, wherein the Bragg grating structure formed by the plurality of index-altered portions scatters a predetermined fraction of light in the predetermined wavelength band propagating in the optical fiber core out of a portion of the cladding layer to form an optical tap.

62. A wavelength stabilized, high power, uncooled laser source, comprising:
at least one high power laser; and
a multimode optical fiber optically coupled to the at least one high power laser, the multimode optical fiber including a multimode core formed of a non-photosensitive material having an initial index of refraction, the multimode core including;
a substantially cylindrical surface;
a longitudinal core axis;
a core radius; and
a plurality of index-altered portions having an altered index of refraction different from the initial index of refraction;
wherein the plurality of index-altered portions are arranged within the non-photosensitive material of the multimode core to form a long period Bragg grating structure for reflecting a predetermined fraction of light in a predetermined wavelength band propagating in the multimode core back into the at least one high power laser to lock an output wavelength band of the wavelength stabilized, high power, uncooled laser source to the predetermined wavelength band.

63. A wavelength stabilized, high power, uncooled laser source according to claim 62, wherein the non-photosensitive material of the multimode core includes at least one of: fused silica; borosilicate; quartz; zirconium fluoride; silver halide; chalcogenide glass; optical plastic; clear fused quartz; aluminosilicate; polymethylmeth-acrylate; polystyrene; acrylic; or arsenic trioxide.

64. A wavelength stabilized, high power, uncooled laser source according to claim 62, wherein the core radius of the multimode core is in the range of about 10 µm to about 200 µm.

65. A wavelength stabilized, high power, uncooled laser source according to claim 62, wherein the altered index of refraction of the plurality of index-altered portions is altered by selective irradiation of the non-photosensitive material by pulses of ultrafast laser light.

66. A wavelength stabilized, high power, uncooled laser source according to claim 62, wherein each of the plurality of index-altered portions has a cylindrical shape including:
a longitudinal index-altered portion axis coaxial to the longitudinal core axis of the multimode core; and
an index-altered portion radius.

67. A wavelength stabilized, high power, uncooled laser source according to claim 66, wherein the index-altered portion radius of each of the plurality of index-altered portions is less than or equal to the core radius of the multimode core, the index-altered portion radius selected to preferentially couple the long period Bragg grating structure to a subset of transverse modes of the multimode core.

68. A wavelength stabilized, high power, uncooled laser source according to claim 66, wherein the index-altered portion radii of the plurality of index-altered portions varies between different index-altered portions in the longitudinal direction of the multimode core such that the long period Bragg grating structure formed by the plurality of index-altered portions is an apodized long period Bragg grating structure.

69. A wavelength stabilized, high power, uncooled laser source according to claim 62, wherein each of the plurality of index-altered portions has annular shape including:
a longitudinal index-altered portion axis coaxial to the longitudinal core axis of the multimode core;
an index-altered portion outer radius; and
an index-altered portion inner radius which is less than the index-altered portion outer radius.

70. A wavelength stabilized, high power, uncooled laser source according to claim 69, wherein:
the index-altered portion outer radius of each of the plurality of index-altered portions is less than or equal to the core radius of the multimode core; and
the index-altered portion outer radius and the index-altered portion inner radius of each of the plurality of index-altered portions are selected to preferentially couple the long period Bragg grating structure to a subset of transverse modes of the multimode optical fiber core.

71. A wavelength stabilized, high power, uncooled laser source according to claim 69, wherein at least one of the index-altered portion outer radii or the index-altered portion inner radii of the plurality of index-altered portions varies between different index-altered portions in the longitudinal direction of the multimode core such that the long period Bragg grating structure is preferentially coupled to a subset of transverse modes of the multimode core.

72. A wavelength stabilized, high power, uncooled laser source according to claim 69, wherein at least one of the index-altered portion outer radii or the index-altered portion inner radii of the plurality of index-altered portions varies between different index-altered portions in the longitudinal direction of the multimode core such that the long period Bragg grating structure formed by the plurality of index-altered portions is an apodized long period Bragg grating structure.

73. A wavelength stabilized, high power, uncooled laser source according to claim 62, wherein each of the plurality of index-altered portions is an annular arcuate segment including:
    an index-altered portion outer radius;
    an index-altered portion inner radius which is less than the index-altered portion outer radius; and
    an angular extent around the longitudinal core axis of the multimode core.

74. A wavelength stabilized, high power, uncooled laser source according to claim 73, wherein:
    the index-altered portion outer radius of each of the plurality of index-altered portions is less than or equal to the core radius of the multimode core; and
    the index-altered portion outer radius, the index-altered portion inner radius, and the angular extent of each of the plurality of index-altered portions are selected to preferentially couple the long period Bragg grating structure to a subset of transverse modes of the multimode core.

75. A wavelength stabilized, high power, uncooled laser source according to claim 73, wherein at least one of the index-altered portion outer radii, the index-altered portion inner radii, or the angular extent of the plurality of index-altered portions varies between different index-altered portions in the longitudinal direction of the multimode core such that the long period Bragg grating structure is preferentially coupled to a subset of transverse modes of the multimode core.

76. A wavelength stabilized, high power, uncooled laser source according to claim 73, wherein at least one of the index-altered portion outer radii, the index-altered portion inner radii, or the angular extent of the plurality of index-altered portions varies between different index-altered portions in the longitudinal direction of the multimode core such that the long period Bragg grating structure formed by the plurality of index-altered portions is an apodized long period Bragg grating structure.

77. A wavelength stabilized, high power, uncooled laser source according to claim 62, wherein:
    the plurality of index-altered portions are arranged within the non-photosensitive material of the multimode core with a longitudinal pitch and each index-altered portion has a longitudinal thickness; and
    the longitudinal thickness and the longitudinal pitch selected such that the long period Bragg grating structure is preferentially coupled to the predetermined wavelength band.

78. A wavelength stabilized, high power, uncooled laser source according to claim 77, wherein the longitudinal thickness of the plurality of index-altered portions is in a range of 10 nm to 20 µm.

79. A wavelength stabilized, high power, uncooled laser source according to claim 78, wherein the longitudinal thickness of the plurality of index-altered portions is in a range of 1 µm to 10 µm.

80. A wavelength stabilized, high power, uncooled laser source according to claim 77, wherein the longitudinal pitch of the plurality of index-altered portions is in a range of 1 µm to 500 µm.

81. A wavelength stabilized, high power, uncooled laser source according to claim 80, wherein the longitudinal pitch of the plurality of index-altered portions is in a range of 15 µm to 20 µm.

82. A wavelength stabilized, high power, uncooled laser source according to claim 62, wherein:
    the long period Bragg grating structure formed by the plurality of index-altered portions includes n subsets of index-altered portions;
    each subset of index-altered portions being longitudinally aligned in a line parallel to the longitudinal core axis of the multimode core;
    a first subset of index-altered portions have a first longitudinal thickness and a first longitudinal pitch within the multimode core selected such that a first portion of the long period Bragg grating structure formed by the first subset of index-altered portions is preferentially coupled to a first subband of wavelengths of the predetermined wavelength band; and
    a second subset of index-altered portions have a second longitudinal thickness and a second longitudinal pitch within the multimode core selected such that a second portion of the long period Bragg grating structure formed by the second subset of index-altered portions is preferentially coupled to a second subband of wavelengths of the predetermined wavelength band which is different than the first subband of wavelengths.

83. A wavelength stabilized, high power, uncooled laser source according to claim 62, wherein the predetermined fraction of light reflected by the long period Bragg grating structure back into the at least one high power laser is up to about 99.9%.

84. A wavelength stabilized, high power, uncooled laser source according to claim 83, wherein the predetermined fraction of light reflected by the long period Bragg grating structure back into the at least one high power laser is in a range of 3% to 20%.

85. A wavelength stabilized, high power, uncooled laser source according to claim 62, wherein the at least one high power laser is a continuous wave semiconductor laser.

86. A wavelength stabilized, high power, uncooled laser source according to claim 62, wherein the at least one high power laser and the multimode optical fiber are substantially thermally uncoupled.

87. A wavelength stabilized, high power, uncooled laser source according to claim 62, wherein the non-photosensitive material of the multimode core has a low coefficient of thermal expansion.

88. A wavelength stabilized, high power, uncooled laser source according to claim 62, wherein the multimode core of the multimode optical fiber includes:

a laser coupling surface normal to the longitudinal core axis optically coupled to the at least one high power laser;

a long period Bragg grating section in which the plurality of index-altered portions are located; and a thermal buffering section extending between the laser coupling surface and the long period Bragg grating section to reduce heating of the long period Bragg grating section by the at least one high power laser during operation.

89. A wavelength stabilized, high power, uncooled laser source according to claim 62, wherein the at least one high power laser is one high power laser.

90. A wavelength stabilized, high power, uncooled laser source according to claim 89, wherein the multimode core of the multimode optical fiber includes:

a laser coupling surface normal to the longitudinal core axis optically coupled to the one high power laser;

a coupling section adjacent to the laser coupling surface with an additional plurality of index-altered portions, the additional plurality of index-altered portions being arranged within the coupling section to form an integral diffractive coupling optics structure; and a long period Bragg grating section in which the plurality of index-altered portions are located.

91. A wavelength stabilized, high power, uncooled laser source according to claim 90, wherein:

the additional plurality of index-altered portions are a plurality of concentric circular annular portions centered on the longitudinal core axis of the multimode core; and the plurality of concentric circular annular portions are sized and arranged such that the integral diffractive coupling optics structure formed in the coupling section of the multimode core is a circular two dimensional diffractive optical lens.

92. A wavelength stabilized, high power, uncooled laser source according to claim 90, wherein:

the additional plurality of index-altered portions are a plurality of concentric elliptical annular portions centered on the longitudinal core axis of the multimode core;

the plurality of concentric elliptical annular portions are sized and arranged such that the integral diffractive coupling optics structure formed in the coupling section of the multimode core is an elliptical two dimensional diffractive optical lens.

93. A wavelength stabilized, high power, uncooled laser source according to claim 90, wherein:

the additional plurality of index-altered portions are a plurality of parallel lines perpendicular to the longitudinal core axis of the multimode core;

the plurality of parallel lines are sized and arranged such that the integral diffractive coupling optics structure formed in the coupling section of the multimode core is a one dimensional diffractive optical lens.

94. A wavelength stabilized, high power, uncooled laser source according to claim 90, wherein the multimode core of the multimode optical fiber further includes:

an output surface normal to the longitudinal core axis for transmitting output laser light from the wavelength stabilized, high power, uncooled laser source; and an output section adjacent to the output surface with a further plurality of index-altered portions, the further plurality of index-altered portions being arranged within the output section to form an integral diffractive output optics structure.

95. A wavelength stabilized, high power, uncooled laser source according to claim 62, wherein the at least one high power laser is a plurality of high power lasers; and the wavelength stabilized, high power, uncooled laser source further comprises a plurality of coupling multimode optical fibers, each coupling multimode optical fiber optically coupling one of the plurality of high power lasers to the multimode optical fiber.

96. A wavelength stabilized, high power, uncooled laser source according to claim 95, wherein:

each coupling multimode optical fiber includes a laser coupling section optically coupled to the corresponding one of the plurality of high power lasers; and each laser coupling section including an additional plurality of index-altered portions arranged to form an integral diffractive coupling optics structure.

97. A wavelength stabilized, high power, uncooled laser source according to claim 96, wherein the multimode core of the multimode optical fiber includes:

a long period Bragg grating section in which the plurality of index-altered portions are located;

an output surface normal to the longitudinal core axis for transmitting output laser light from the wavelength stabilized, high power, uncooled laser source; and an output section adjacent to the output surface with a further plurality of index-altered portions, the further plurality of index-altered portions being arranged within the output section to form an integral diffractive output optics structure.

98. A wavelength stabilized, high power, uncooled laser source according to claim 62, wherein the multimode core of the multimode optical fiber includes:

a long period Bragg grating section in which the plurality of index-altered portions are located;

an output surface normal to the longitudinal core axis for transmitting output laser light from the wavelength stabilized, high power, uncooled laser source; and an output section adjacent to the output surface with an additional plurality of index-altered portions, the further plurality of index-altered portions being arranged within the output section to form an integral diffractive output optics structure.

99. A wavelength stabilized, high power, uncooled laser source according to claim 98, wherein:

the additional plurality of index-altered portions are a plurality of concentric circular annular portions centered on the longitudinal core axis of the multimode core; and the plurality of concentric circular annular portions are sized and arranged such that the integral diffractive output optics structure formed in the output section of the multimode core is a circular two dimensional diffractive optical lens.

100. A wavelength stabilized, high power, uncooled laser source according to claim 98, wherein:

the additional plurality of index-altered portions are a plurality of concentric elliptical annular portions centered on the longitudinal core axis of the multimode core;

the plurality of concentric elliptical annular portions are sized and arranged such that the integral diffractive output optics structure formed in the output section of the multimode core is an elliptical two dimensional diffractive optical lens.

101. A wavelength stabilized, high power, uncooled laser source according to claim 98, wherein:

the additional plurality of index-altered portions are a plurality of parallel lines perpendicular to the longitudinal core axis of the multimode core;

the plurality of parallel lines are sized and arranged such that the integral diffractive output optics structure formed in the output section of the multimode core is a one dimensional diffractive optical lens.

102. A multimode optical fiber with a helical fiber Bragg grating, comprising:

a multimode optical fiber core formed of a non-photosensitive material having an initial index of refraction, the multimode optical fiber core includes;
  a substantially cylindrical surface;
  a longitudinal core axis;
  a core radius; and
  a helical index-altered portion having an altered index of refraction different from the initial index of refraction;
wherein;
  the helical index-altered portion includes a longitudinal index-altered portion axis coaxial to the longitudinal core axis of the multimode core, an index-altered portion outer radius, an index-altered portion inner radius which is less than the index-altered portion outer radius, and a longitudinal pitch; and
  the helical index-altered portion is arranged within the non-photosensitive material of the multimode optical fiber core to form a long period Bragg grating structure.

103. A fiber Bragg grating for a predetermined wavelength band, comprising:

an optical fiber core having a core index of refraction;
  a substantially cylindrical surface;
  a longitudinal core axis; and
  a core radius; and
a cladding layer formed of a non-photosensitive material on the substantially cylindrical surface of the optical fiber core, the non-photosensitive material of the cladding layer having an initial cladding index of refraction lower than the core index of refraction of the optical fiber core, the cladding layer includes;
  an outer cladding radius; and
  a plurality of index-altered portions having an altered index of refraction different from the initial cladding index of refraction;
wherein;
  each of the plurality of index-altered portions of the cladding layer extends into the cladding layer from the substantially cylindrical surface of the optical fiber core;
  each of the plurality of index-altered portions is an annular arcuate segment including:
    an index-altered portion inner radius which is equal to the core radius of the optical fiber core;
    an index-altered portion outer radius which is less than or equal to the outer cladding radius of the cladding layer; and
    an angular extent less than 180° around the longitudinal core axis of the optical fiber core;
  at least one of the index-altered portion outer radii or the angular extent of the plurality of index-altered portions varies between different index-altered portions in the longitudinal direction of the optical fiber core; and
  the plurality of index-altered portions are arranged within the non-photosensitive material of the cladding layer to form an apodized Bragg grating structure.

104. A fiber Bragg grating according to claim 103, wherein the angular extent of the plurality of index-altered portions is equal to approximately 360°/n, where n is an integer greater than 1.

105. A fiber Bragg grating according to claim 103, wherein:
  the angular extent of the plurality of index-altered portions is less than 360°/n, where n is an integer greater than 1;
  the Bragg grating structure formed by the plurality of index-altered portions includes n subsets of annular arcuate segments;
  each subset of annular arcuate segments being longitudinally aligned in a line parallel to the longitudinal core axis of the optical fiber core at a subset angle, the subset angles of neighboring subsets of annular arcuate segments having an angular separation of approximately 360°/n.

106. A fiber Bragg grating according to claim 105, wherein:
  a first subset of annular arcuate segments have a first longitudinal thickness and a first longitudinal pitch within the cladding layer selected such that a first portion of the Bragg grating structure formed by the first subset of annular arcuate segments is preferentially coupled to a first subband of wavelengths of the predetermined wavelength band; and
  a second subset of annular arcuate segments have a second longitudinal thickness and a second longitudinal pitch within the cladding layer selected such that a second portion of the Bragg grating structure formed by the second subset of annular arcuate segments is preferentially coupled to a second subband of wavelengths of the predetermined wavelength band which is different than the first subband of wavelengths of the predetermined wavelength band.

107. A fiber Bragg grating according to claim 103, wherein the plurality of annular arcuate segments are longitudinally arranged in a helix within the cladding layer, angles of neighboring annular arcuate segments having an angular separation of approximately 360°/n, where n is an integer greater than 1.

108. A fiber Bragg grating according to claim 103, wherein the plurality of annular arcuate segments are longitudinally arranged in a line parallel to the longitudinal core axis of the optical fiber core.

* * * * *